(12) United States Patent
Yoscovits et al.

(10) Patent No.: US 10,803,396 B2
(45) Date of Patent: Oct. 13, 2020

(54) QUANTUM CIRCUIT ASSEMBLIES WITH JOSEPHSON JUNCTIONS UTILIZING RESISTIVE SWITCHING MATERIALS

(71) Applicant: Intel Corporation, Santa Clara, CA (US)

(72) Inventors: Zachary R. Yoscovits, Beaverton, OR (US); Roman Caudillo, Portland, OR (US); Ravi Pillarisetty, Portland, OR (US); Hubert C. George, Portland, OR (US); Adel A. Elsherbini, Chandler, AZ (US); Lester Lampert, Portland, OR (US); James S. Clarke, Portland, OR (US); Nicole K. Thomas, Portland, OR (US); Kanwaljit Singh, Rotterdam (NL); David J. Michalak, Portland, OR (US); Jeanette M. Roberts, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/011,812

(22) Filed: Jun. 19, 2018

(65) Prior Publication Data
US 2019/0042967 A1  Feb. 7, 2019

(51) Int. Cl.
*G06N 10/00* (2019.01)
*H01L 27/18* (2006.01)
(Continued)

(52) U.S. Cl.
CPC .............. *G06N 10/00* (2019.01); *B82Y 10/00* (2013.01); *G11C 11/44* (2013.01); *H01L 27/18* (2013.01);
(Continued)

(58) Field of Classification Search
CPC ................. H01L 39/2493; H01L 27/18; H01L 29/66439; H01L 29/66977; H01L 45/146;
(Continued)

(56) References Cited

U.S. PATENT DOCUMENTS 6,476,413 B1 * 11/2002 Jia .......................... H01L 39/225
257/31
2010/0021626 A1  1/2010 Hsieh et al.
(Continued)

FOREIGN PATENT DOCUMENTS

JP  2010287683 A  12/2010
KR  20130052371 A  5/2013
(Continued)

OTHER PUBLICATIONS

"Embracing the quantum limit in silicon computing," Morton et al, Macmillan Publishers, Nov. 17, 2011, vol. 479, Nature, pp. 345-353.
(Continued)

*Primary Examiner* — Thanh Y. Tran
(74) *Attorney, Agent, or Firm* — Patent Capital Group

(57) ABSTRACT

Disclosed herein are superconducting qubit devices with Josephson Junctions utilizing resistive switching materials, i.e., resistive Josephson Junctions (RJJs), as well as related methods and quantum circuit assemblies. In some embodiments, an RJJ may include a bottom electrode, a top electrode, and a resistive switching layer (RSL) disposed between the bottom electrode and the top electrode. Using the RSLs in Josephson Junctions of superconducting qubits may allow fine tuning of junction resistance, which is particularly advantageous for optimizing performance of superconducting qubit devices. In addition, RJJs may be fabricated using methods that could be efficiently used in large-scale manufacturing, providing a substantial improvement with respect to approaches for forming conventional
(Continued)

Josephson Junctions, such as e.g. double-angle shadow evaporation approach.

25 Claims, 12 Drawing Sheets

(51) Int. Cl.
| | |
|---|---|
| *H03K 19/195* | (2006.01) |
| *B82Y 10/00* | (2011.01) |
| *H03K 17/92* | (2006.01) |
| *G11C 11/44* | (2006.01) |
| *H01L 45/00* | (2006.01) |
| *H01L 39/22* | (2006.01) |
| *H01L 39/24* | (2006.01) |
| *H01L 29/66* | (2006.01) |

(52) U.S. Cl.
CPC ...... *H01L 29/66977* (2013.01); *H01L 39/223* (2013.01); *H01L 39/2493* (2013.01); *H01L 45/08* (2013.01); *H01L 45/1233* (2013.01); *H01L 45/146* (2013.01); *H03K 17/92* (2013.01); *H03K 19/1952* (2013.01); *H01L 29/66439* (2013.01)

(58) Field of Classification Search
CPC .......... H01L 45/08; H01L 39/223–226; H03K 17/92; B82Y 10/00; G11C 11/44; G06N 99/002; Y10S 977/933
See application file for complete search history.

(56) References Cited

U.S. PATENT DOCUMENTS

| | | | |
|---|---|---|---|
| 2013/0043451 A1 | 2/2013 | Lee et al. | |
| 2013/0170278 A1 | 7/2013 | Chen et al. | |
| 2013/0300509 A1* | 11/2013 | Kim | ............... H03L 7/00 331/34 |
| 2014/0145189 A1 | 5/2014 | Sievers | |
| 2014/0175361 A1 | 6/2014 | Hsueh et al. | |
| 2015/0270134 A1 | 9/2015 | Xu et al. | |
| 2018/0232653 A1* | 8/2018 | Selvanayagam | ........ H01P 5/028 |
| 2018/0233665 A1* | 8/2018 | Chen | .................. H01L 45/146 |
| 2018/0309054 A1* | 10/2018 | Majhi | .................. H01L 45/08 |
| 2019/0378874 A1* | 12/2019 | Rosenblatt | ............. B82Y 10/00 |

FOREIGN PATENT DOCUMENTS

| | | |
|---|---|---|
| WO | 2016105407 A1 | 6/2016 |
| WO | 2017217959 A1 | 12/2017 |
| WO | 2017217960 A1 | 12/2017 |
| WO | 2017217961 A1 | 12/2017 |
| WO | 2018030977 A1 | 2/2018 |
| WO | 2018044255 A1 | 3/2018 |
| WO | 2018044256 A1 | 3/2018 |
| WO | 2018044257 A1 | 3/2018 |

OTHER PUBLICATIONS

"Independent, extensible control of same-frequency superconducting qubits by selective broadcasting," Asaad et al., Netherlands Organisation for Applied Scientific Research, Aug. 28, 2015, 17 pages.

"Magnetic field tuning of coplanar waveguide resonators," Healey, et al., Applied Physics Letters 93, 043513 (2008), pp. 043513-1 through 043513-3 (4 pages with cover sheet).

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.

"Scalable quantum circuit and control for a superconducting surface code," Versluis et al, Netherlands Organisation for Applied Scientific Research, Dec. 28, 2016, 9 pages.

"Surface loss simulations of superconducting coplanar waveguide resonators," Wenner et al, Applied Physics Letters 99, 113513 (2011), pp. 113513-1 through 113513-3.

"Suspending superconducting qubits by silicon micromachining," Chu et al., Department of Applied Physics, Yale University, Jun. 10, 2016, 10 pages.

International Search Report and Written Opinion for International Patent Application No. PCT/US2016/0149195 dated Apr. 25, 2017, 13 pages.

International Search Report and Written Opinion for International Patent Application No. PCT/US2016/0149196 dated Apr. 25, 2017, 13 pages.

International Search Report and Written Opinion for International Patent Application No. PCT/US2016/0149197 dated Apr. 25, 2017, 13 pages.

* cited by examiner

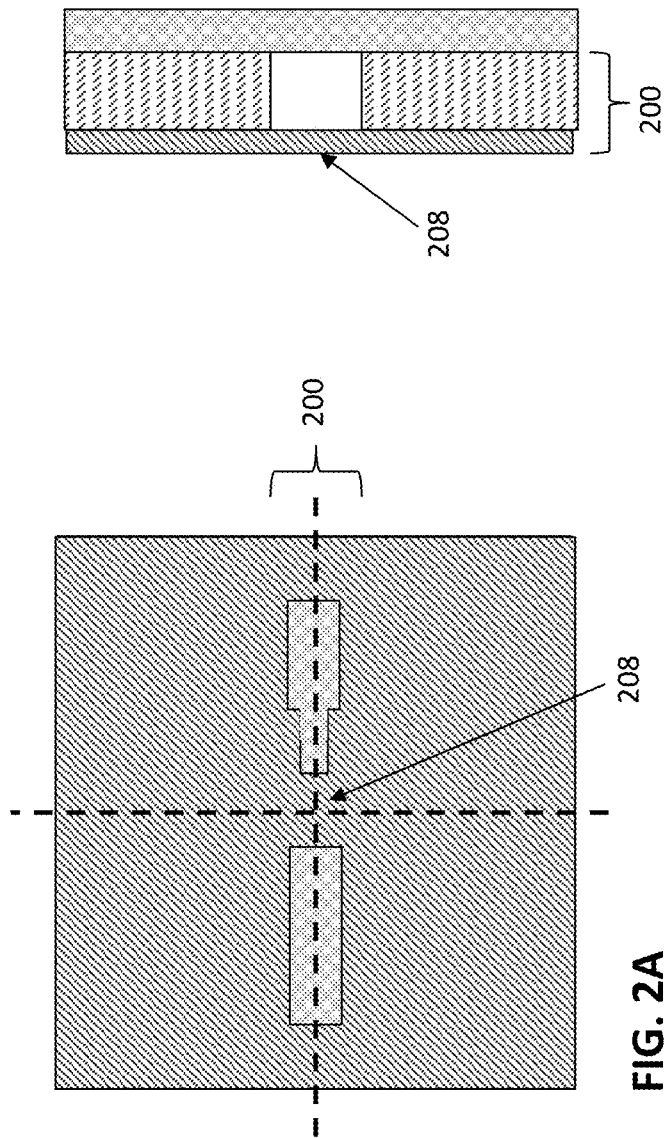
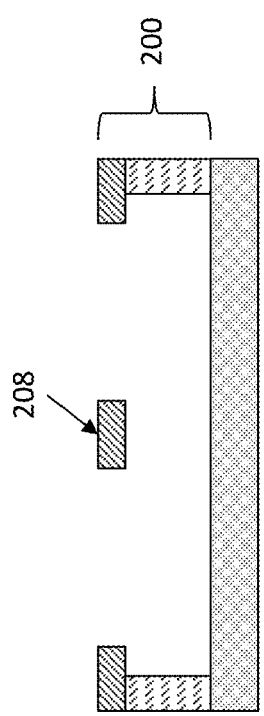
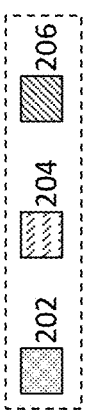

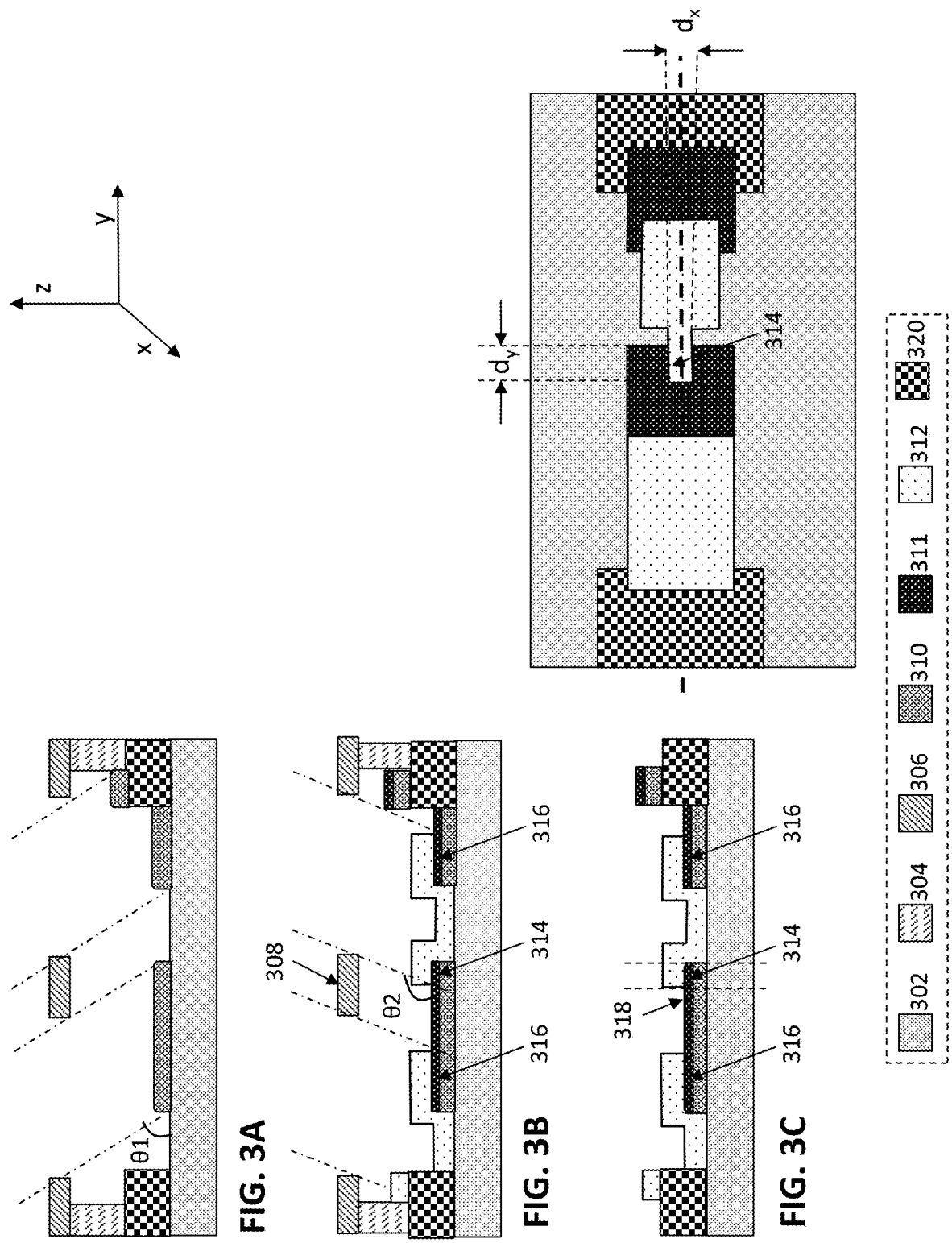

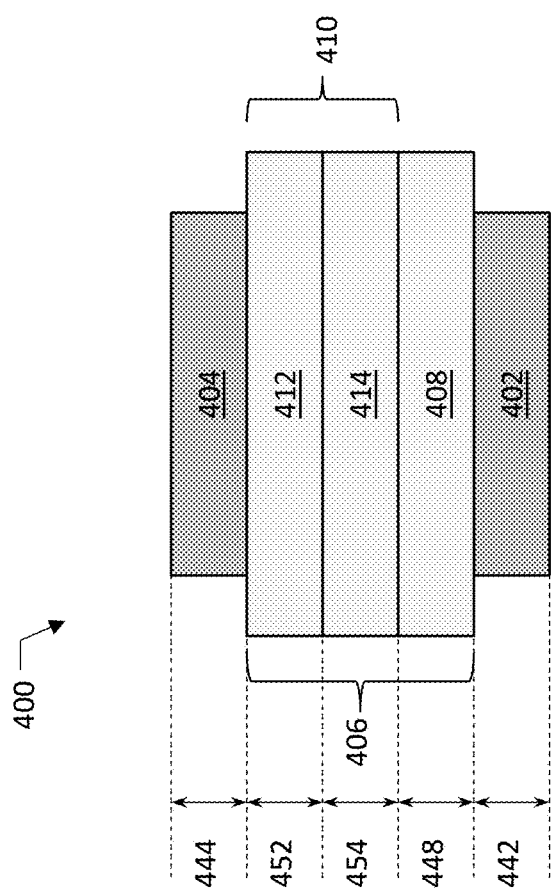

QUANTUM CIRCUIT ASSEMBLIES WITH JOSEPHSON JUNCTIONS UTILIZING RESISTIVE SWITCHING MATERIALS

TECHNICAL FIELD

This disclosure relates generally to the field of quantum computing, and more specifically, to Josephson Junctions for use in quantum circuits.

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a nontrivial task because the unique quantum-mechanical phenomena in such circuits lead to unique considerations which never had to be dealt with in classical, non-quantum, circuits, such as e.g. taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance and manufactured using existing process tools of leading edge device manufacturers also grows.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 2A-2C provide a schematic illustration of a photoresist mask provided over a substrate for fabricating a Josephson Junction using a double-angle shadow evaporation approach.

FIGS. 3A-3C provide a schematic illustration of fabricating Josephson Junctions using a conventional double-angle shadow evaporation approach.

FIGS. 7A-7B are cross-sectional side views illustrating various layers that may be included in an RJJ, in accordance with various embodiments of the present disclosure.

DETAILED DESCRIPTION

Overview

Figure 1:
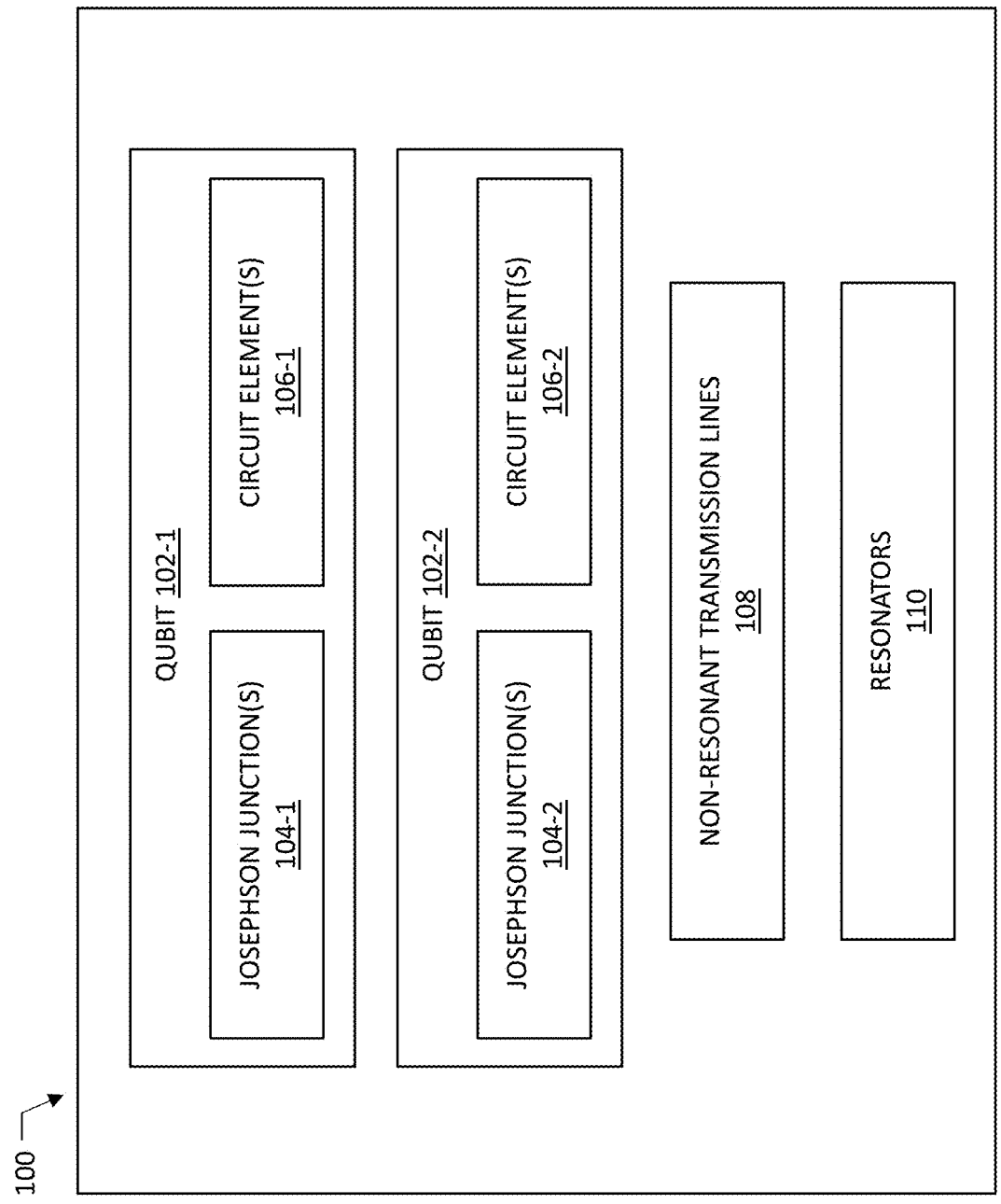
FIG. 1 provides a schematic illustration of an example superconducting quantum circuit assembly in accordance with various embodiments of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits may be represented by a superposition of $2^N$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e. by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e. computers that use phenomena of classical physics). Therefore, both industry and academia continue to focus on a search for new and improved physical systems whose functionality could approach that expected of theoretically designed qubits.

Physical systems for implementing qubits that have been explored until now include e.g. superconducting qubits (e.g. flux qubits or transmon qubits, the latter also referred to simply as "transmons"), semiconducting qubits including those made using quantum dots (e.g., spin qubits and charge qubits), photon polarization qubits, single trapped ion qubits, etc.

Out of the various physical implementations of qubits listed above, superconducting qubits are promising candidates for building a quantum computer. All of superconducting qubits operate based on the Josephson effect, which refers to a macroscopic quantum phenomenon of supercurrent, i.e. a current that, due to zero electrical resistance, flows indefinitely long without any voltage applied, across a device known as a Josephson Junction.

Josephson Junctions are integral building blocks in superconducting quantum circuits where they form the basis of quantum circuit elements that can approximate functionality of theoretically designed qubits. Therefore, improvements with respect to fabricating Josephson Junctions for use in quantum circuit assemblies are always desirable. In particular, it would be desirable to have methods for fabricating Josephson Junctions that have adequate performance and can be manufactured on large-scale.

Disclosed herein are superconducting qubit devices with Josephson Junctions utilizing resistive switching materials (such Josephson Junctions are referred to herein as "RJJs"), as well as related manufacturing methods, methods of operation, quantum circuit assemblies, quantum integrated circuit (IC) packages, and quantum computing devices. In some embodiments, an RJJ may include a bottom electrode, a top electrode, and a resistive switching layer (RSL) (i.e. a layer including one or more resistive switching materials). The bottom electrode may be disposed between the RSL and a substrate, and the RSL may be disposed between the bottom electrode and the top electrode. Using the RSL in Josephson Junctions of superconducting qubits may allow fine tuning of junction resistance, and is reversible if a wrong resistance is achieved, which is particularly advantageous for optimizing performance of fragile superconducting qubit devices. Using the RSL may also help decrease amount of spurious (i.e. unintentional and undesirable) two-level systems (TLS's), thought to be the dominant source of superconducting qubit decoherence, in the vicinity of Josephson Junctions. In addition, RJJs may be fabricated using methods that could be efficiently used in large-scale manufacturing, providing a substantial improvement with respect to approaches for forming conventional Josephson Junctions, such as e.g. double-angle shadow evaporation approach, that include fabrications steps not suitable for implementing with larger wafer sizes used by leading edge device manufactures.

In order to provide substantially lossless connectivity to, from, and between the qubits, some or all of the electrically conductive portions of quantum circuit assemblies described herein, in particular the top and bottom electrodes of the RJJs described herein, leads to such electrodes, as well as other electrically conductive components of quantum circuits described herein, may be made from one or more superconducting materials. However, some or all of these electrically conductive portions could be made from electrically conductive materials which are not superconducting. In the following, unless specified otherwise, reference to an electrically conductive material implies that a superconducting material can be used, and vice versa. Furthermore, materials described herein as "superconducting materials" may refer to materials, including alloys of materials, that exhibit superconducting behavior at typical qubit operating conditions (e.g. materials which exhibit superconducting behavior at very low temperatures at which qubits typically operate), but which may or may not exhibit such behavior at higher temperatures (e.g. at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

While some descriptions are provided with reference to superconducting qubits, in particular to transmons, a particular class of superconducting qubits, at least some teachings of the present disclosure may be applicable to implementations of any qubits, including superconducting qubits other than transmons and/or including qubits other than superconducting qubits, which may employ non-linear inductive elements, such as Josephson Junctions, all of which implementations are within the scope of the present disclosure. For example, the quantum circuit device assemblies described herein may be used in hybrid semiconducting-superconducting quantum circuits.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g. "lossless" (or "low-loss") or "superconducting," are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Quantum Computing and Josephson Junctions

FIG. 1 provides a schematic illustration of an example superconducting quantum circuit assembly 100 that may include, or be included in, any of the quantum circuit assemblies described herein.

As shown in FIG. 1, the quantum circuit assembly 100 may include two or more qubits 102 (which may also be referred to as "qubit devices" 102). In the following description, reference numerals provided after a dash, e.g. reference numerals 102-1 and 102-2, indicate different instances of the same or analogous element. Each of the superconducting qubits 102 may include one or more Josephson Junctions 104 electrically connected to one or more other circuit elements 106, which, in combination with the Josephson Junction(s) 104, form a non-linear circuit providing a unique two-level quantum state for the qubit. In general, a Josephson Junction includes two superconductors (typically referred to as "electrodes" of a Josephson Junction) coupled by a so-called weak link (typically referred to as a "barrier" or a "tunnel barrier" of a Josephson Junction) that weakens the superconductivity between the two superconductors. In various embodiments of the present disclosure, weak links of at least one, but preferably all, Josephson Junctions 104 of at least one, but preferably all, qubits 102 may be implemented by providing an RSL that includes one or more resistive switching materials, sandwiched, in a stack-like arrangement, between the two superconductors. In other words, in various embodiments, at least one, but preferably all, Josephson Junctions 104 of at least one, but preferably all, qubits 102 may be an RJJ as described herein. As discussed in greater detail below, during operation, the RJJ 104 may switch between two different non-volatile states: a high resistance state (HRS) and a low resistance state (LRS), where resistive switching of the RSL may be used to tune the resistance of the RJJ 104 to the desired value or range. The resistance state of the RJJ 104 may be used to control the critical current of a Josephson Junction more precisely than what is possible with conventional Josephson Junctions.

A Josephson Junction, e.g. any of the RJJs described herein, provides a non-linear inductive element to the circuit and allows the qubit to become an anharmonic oscillator. The anharmonicity is determined by the ratio of the charging energy, which stems from the total capacitance between a first and second element of the qubit, and the Josephson energy of the non-linear inductive element (e.g., Josephson Junction). The anharmonicity is what allows the state of the qubit to be controlled to a high level of fidelity by creating a 2-level system, e.g. ground state and first excited state that have energy separation substantially different than first- and second-excited states or transitions between other higher-level excited states. In addition to controlling the anharmonicity, the ratio between charging and Josephson energies also control the qubit frequency. The charge noise of a superconducting qubit can be reduced by implementing a shunt capacitor in parallel to the Josephson Junction(s). A large shunt capacitance has the effect of reducing the charging energy; this comes at the cost of reduced anharmonicity, but the reduction in charge noise at the cost of reduced anharmonicity is often beneficial, and when implemented in such a way so as to make the Josephson energy about 50 times greater than the charging energy (a regime typically referred to as the "transmon regime") a qubit with enough anharmonicity can be maintained while simultaneously reducing charge noise and thus extending qubit coherence times.

Typically, when a qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit even without the presence of a tunable capacitive element. This, in turn, allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing direct current (DC) or a pulse of current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies. In various embodiments of the present disclosure, at least some of the qubits 102 may include a SQUID where at least one Josephson Junction 104 of the SQUID, but preferably two or more Josephson Junctions 104 of the SQUID, is/are the RJJ(s) as described herein.

Turning back to FIG. 1, within each qubit 102, the one or more Josephson Junctions 104 may be coupled (e.g. directly electrically connected) to one or more other circuit elements 106, which, in combination with the Josephson Junction(s) 104, form a non-linear oscillator circuit providing multi-level quantum system where the first two to three levels define the qubit under normal operation. The circuit elements 106 could be e.g. shunt capacitors (i.e. capacitors connected in electrical parallel to one or more non-linear inductive elements such as Josephson Junctions 104), superconducting loops of a SQUID, electrodes for setting an overall capacitance of a qubit, or/and ports for capacitively coupling the qubit to one or more of a readout resonator, a coupling resonator, and a direct microwave drive line, or electromagnetically coupling the qubit to a flux bias line.

As also shown in FIG. 1, an example quantum circuit assembly 100 may include a plurality of non-resonant transmission lines 108, and, in some cases, a plurality of resonators 110.

The non-resonant transmission lines 108 are typically used for providing microwave signals to different quantum circuit elements and components, which elements and components include e.g. readout resonators for various qubits, and may be considered to implement external readout and/or control of qubits. For example, for superconducting qubits, examples of the non-resonant transmission lines 108 include flux bias lines, microwave lines, and drive lines. In another example, for quantum dot qubits, examples of the non-resonant transmission lines 108 include lines that may control microwave pulses applied to gates and/or the doped regions of quantum dot device(s) in order to control spins of charge carriers in quantum dots formed in such device(s) or microwave pulses transmitted over a conductive pathway to induce a magnetic field in magnet line(s) of quantum dot devices.

On the other hand, the resonators 110 may be viewed as implementing internal control lines for qubits. For superconducting qubits, examples of the resonators 100 include coupling and readout resonators.

In general, a resonator 110 of a quantum circuit differs from a non-resonant microwave transmission line 108 in that a resonator is deliberately designed to support resonant oscillations (i.e. resonance), under certain conditions. In contrast, non-resonant transmission lines may be similar to conventional microwave transmission lines in that they are designed to avoid resonances, especially resonances at frequencies/wavelengths close to the resonant frequencies/wavelengths of any resonant object used in the quantum computing circuits, e.g., qubits, bus resonators, or readout resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible.

On-chip capacitive coupling between quantum or control elements can be achieved either through use of coupling components such as a coupling component on a neighboring qubit, a lumped element capacitor, a lumped element resonator, or a transmission line segment. A resonator is a transmission line segment that is made by employing fixed boundary conditions, and these boundary conditions control the frequencies/wavelengths which will resonate within a given transmission line segment used to implement a resonator. In order to satisfy boundary conditions for resonance, each end of a transmission line segment resonator can be either a node, if it is shorted to ground (e.g. where one end of the transmission line segment structure is electrically connected to a ground plane), or an antinode, if it is capacitively or inductively coupled to ground or to another quantum circuit element. Thus, resonators 110 differ from non-resonant microwave transmission lines 108 in how these lines are terminated at the relevant ends. A line used to route a signal on a substrate, i.e. one of the non-resonant transmission lines 108, typically extends from a specific source, e.g. a bonding pad or another type of electrical connection to a source, to a specific load (e.g. a short circuit proximate to SQUID loop, a quantum dot device, another bonding pad, or another electrical connection to a load). In other words, non-resonant transmission lines 108 terminate with electrical connections to sources, ground sinks, and/or loads. On the other hand, a transmission line resonator is typically composed of a piece of transmission line terminated with either two open circuits (in case of a half-wavelength resonator) or an open and a short circuit (in case of a quarter-wavelength resonator). In this case, for a desired resonant frequency, transmission line length may e.g. be a multiple of a microwave wavelength divided by 2 or 4, respectively. However, other terminations are possible, for example capacitive or inductive, and in this case the required line length to support resonance will be different from that identified above. For example, capacitive terminations may be used for resonators which are coupled to qubits, to a feedline, line, or to another resonator by a capacitive interaction.

Besides line termination by capacitive or inductive coupling or a short circuit, in order to support resonant oscillations, transmission line segments of the resonators 110 need to be of a specific length that can support such oscillations. That is why, often times, resonators 110 may be laid out on a substrate longer than the actual distance would require (i.e. a non-resonant transmission line would typically be laid out to cover the distance in the most compact manner possible, e.g. without any curves, wiggles, or excess length, while a resonator may need to have curves, wiggles, and be longer than the shortest distance between the two elements the resonator is supposed to couple in order to be sufficiently long to support resonance).

One type of the resonators 110 used with superconducting qubits are so-called coupling resonators (also known as "bus resonators"), which provide one manner for coupling different qubits together in order to realize quantum logic gates. These types of resonators are analogous in concept and have analogous underlying physics as readout resonators, except that a coupling or "bus" resonator involves only capacitive couplings between two or more qubits whereas a readout resonator involves capacitive coupling between one or more qubits and a feedline. A coupling resonator may be implemented as a microwave transmission line segment that includes capacitive or inductive connections to ground on both sides (e.g. a half-wavelength resonator), which results in oscillations (resonance) within the transmission line. While the ends of a coupling resonator have open circuits to the ground, each side of a coupling resonator is coupled, either capacitively or inductively, to a respective (i.e. different) qubit by being in the appropriate location and sufficient proximity to the qubit. Because different regions of a coupling resonator have coupling with a respective different qubit, the two qubits are coupled together through the coupling resonator. Thus, coupling resonators may be employed for implementing logic gates.

Another type of the resonators 110 used with superconducting qubits are so-called readout resonators, which may be used to read the state(s) of qubits. In some embodiments, a corresponding readout resonator may be provided for each qubit. A readout resonator, similar to the bus coupling resonator, is a transmission line segment. On one end it may have an open circuit connection to ground as well as any capacitively or inductively coupled connections to other quantum elements or a non-resonant microwave feedline. On the other end, a readout resonator may either have a capacitive connection to ground (for a half-wavelength resonator) or may have a short circuit to the ground (for a quarter-wavelength resonator), which also results in oscillations within the transmission line, with the resonant frequency of the oscillations being close to the frequency of the qubit. A readout resonator is coupled to a qubit by being in the appropriate location and sufficient proximity to the qubit, again, either through capacitive or inductive coupling. Due to a coupling between a readout resonator and a qubit, changes in the state of the qubit result in changes of the resonant frequency of the readout resonator. In turn, changes in the resonant frequency of the readout resonator can be read externally via connections which lead to external electronics e.g. wire or solder bonding pads.

For the non-resonant transmission lines 108, some descriptions of flux bias lines were provided above and, in the interests of brevity are not repeated here. In general, running a current through a flux bias line, provided e.g. from a wirebonding pads, solder bump, mechanical connector, or any other connection element, allows tuning (i.e. changing) the frequency of a corresponding qubit 102 to which a given flux bias line is connected. As a result of running the current in a given flux bias line, magnetic field is created around the line. If such a magnetic field is in sufficient proximity to a given qubit 102, e.g. by a portion of the flux bias line being provided next (sufficiently close) to the qubit 102, the magnetic field couples to the qubit, thereby changing the Josephson energy and thus the spacing between the energy levels of the qubit. This, in turn, changes the frequency of the qubit since the frequency is directly related to the spacing between the energy levels via the equation $E=h\nu$ (Planck's equation), where E is the energy (in this case the energy difference between energy levels of a qubit), h is the Planck's constant and $\nu$ is the frequency (in this case the frequency of the qubit). As this equation illustrates, if E changes, then $\nu$ changes. Different currents and pulses of currents can be sent down each of the flux lines allowing for independent tuning of the various qubits.

Typically, the qubit frequency may be controlled in order to bring the frequency either closer to or further away from another resonant item, for example a coupling resonator or a coupled neighbor qubit, to implement multi-qubit interactions, as may be desired in a particular setting.

For example, if it is desirable that a first qubit 102-1 and a second qubit 102-2 interact, via a coupling resonator (i.e. an example of the resonators 110) connecting these qubits, then both qubits 102 may need to be tuned to be at nearly the same frequency or a detuning equal, or nearly equal, to the anharmonicity. One way in which such two qubits could interact is that, if the frequency of the first qubit 102-1 is tuned very close to the resonant frequency of the coupling resonator, the first qubit can, when in the excited state, relax back down to the ground state by emitting a photon (similar to how an excited atom would relax) that would resonate within the coupling resonator. If the second qubit 102-2 is also at this energy (i.e. if the frequency of the second qubit is also tuned very close to the resonant frequency of the coupling resonator), then it can absorb the photon emitted from the first qubit, via the coupling resonator coupling these two qubits, and be excited from its ground state to an excited state. Thus, the two qubits interact, or are entangled, in that a state of one qubit is controlled by the state of another qubit. In other scenarios, two qubits could interact via exchange of virtual photons, where the qubits do not have to be tuned to be at the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator or on the neighboring qubit via a virtual photon transfer through the bus. If there is nowhere for such a frequency-detuned photon to go, the qubit will be better isolated from its surroundings and will live longer in its current state. Thus, in general, two or more qubits could be configured to reduce interactions with one another by tuning their frequencies to specific values or ranges.

The state(s) of each qubit 102 may be read by way of its corresponding readout resonator of the resonators 110. As explained below, the state of qubit 102 induces a shift in the resonant frequency in the associated readout resonator. This shift in resonant frequency can then be read out using its coupling to a feedline. To that end, an individual readout resonator may be provided for each qubit. As described above, a readout resonator may be a transmission line segment that includes a capacitive connection to ground on one side and is either shorted to the ground on the other side (for a quarter-wavelength resonator) or has a capacitive connection to ground (for a half-wavelength resonator), which results in oscillations within the transmission line (resonance) that depends upon the state of a proximal qubit. A readout resonator may be coupled to its corresponding qubit 102 by being in an appropriate location and sufficient proximity to the qubit, more specifically in an appropriate location and sufficient proximity to a first element (or "island") of the qubit 102 that capacitively couples to the readout resonator, when the qubit is implemented as a transmon. Due to a coupling between the readout resonator and the qubit, changes in the state of the qubit result in changes of the resonant frequency of the readout resonator. In turn, by ensuring that the readout resonator is in sufficient proximity to a corresponding microwave feedline, changes in the resonant frequency of the readout resonator induce changes in the transmission coefficients of the microwave feedline which may be detected externally.

A coupling resonator, or, more generally, a coupling component, allows coupling different qubits together, e.g. as described above, in order to realize quantum logic gates. A coupling component could be comprised of a coupling component on a neighboring qubit, a lumped element capacitor, a lumped element resonator, or a transmission line segment. A coupling transmission line segment (e.g., coupling resonator or bus resonator) is similar to a readout resonator in that it is a transmission line segment that includes capacitive connections to various objects (e.g., qubits, ground, etc.) on both sides (i.e. a half-wavelength resonator), which also results in oscillations within the coupling resonator. Each side/end of a coupling component is coupled (again, either capacitively or inductively) to a respective qubit by being in appropriate location and sufficient proximity to the qubit, namely in sufficient proximity to a first element (or "island") of the qubit that capacitively couples to the coupling component, when the qubit is implemented as a transmon. Because each side of a given coupling component has coupling with a respective different qubit, the two qubits are coupled together through the coupling component. Thus, coupling components may be employed in order to implement multi-qubit interactions.

In some implementations, a microwave line (also sometimes referred to as a "microwave feedline" or simply a "feedline") may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines may be used to only readout the state of the qubits as described above, while separate drive lines, may be used to control the state of the qubits. In such implementations, microwave lines used for readout may be referred to as "microwave readout lines," while microwave lines used for controlling the quantum state of the qubits may be referred to as "microwave drive lines." Microwave drive lines may control the state of their respective qubits 102 by providing to the qubits a microwave pulse at or close to the qubit frequency, which in turn stimulates (i.e. triggers) a transition between the states of the qubit. By varying the length of this pulse, a partial transition can be stimulated, giving a superposition of the states of the qubit.

Flux bias lines, microwave lines, readout lines, drive lines, coupling components, and readout resonators, such as e.g. those described above, together form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of SQUIDs or connections between two ground lines of a particular transmission line for equalizing electrostatic potential on the two ground lines, may also be referred to as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog-to-digital converters, mixers, multiplexers, amplifiers, etc.

In various embodiments, various conductive circuit elements of supporting circuitry included in a quantum circuit such as the quantum circuit assembly 100 could have different shapes and layouts. In general, the term "line" as used herein in context of signal lines or transmission lines does not imply straight lines, unless specifically stated so. For example, some resonant or non-resonant transmission lines or parts thereof (e.g. conductor strips of resonant or non-resonant transmission lines) may comprise more curves, wiggles, and turns while other resonant or non-resonant transmission lines or parts thereof may comprise less curves, wiggles, and turns, and some transmission lines or parts thereof may comprise substantially straight lines.

Figure 6:
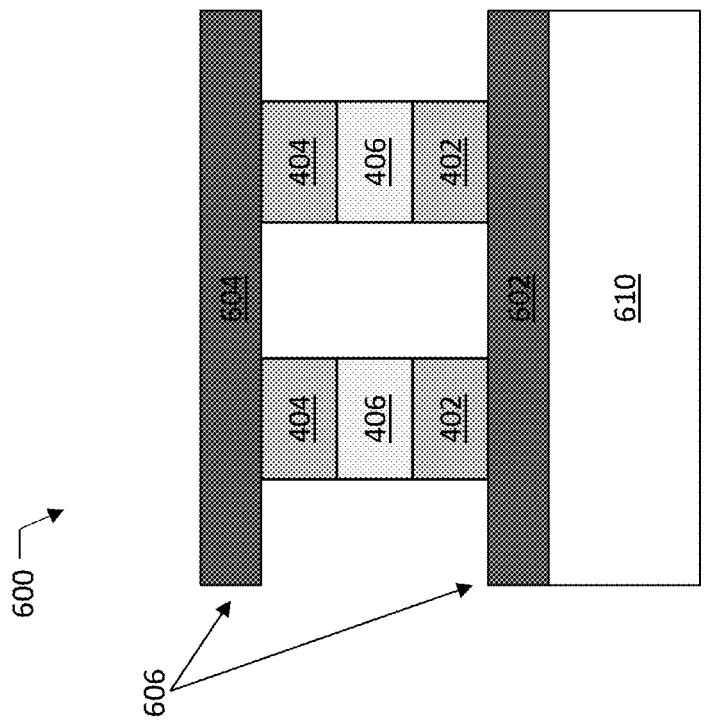
FIG. 6 is a cross-sectional side view of one example of two RJJs electrically coupled to a shunt capacitor, in accordance with various embodiments of the present disclosure.

The qubits 102, the non-resonant transmission lines 108, and the resonators 110 of the quantum circuit assembly 100 may be provided on, over, or at least partially embedded in a substrate (not shown in FIG. 1, but shown, as an example, in the embodiment illustrated in FIG. 6). The substrate may be any substrate suitable for realizing quantum circuit assemblies described herein. In one embodiment, the substrate may be a crystalline substrate such as, but not limited to a silicon or a sapphire substrate, and may be provided as a wafer or a portion thereof. In other embodiments, the substrate may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure. Additional examples of substrates that may be used for forming quantum circuit assemblies as described herein on include silicon-on-insulator (SOI) substrates, III-V substrates, and quartz substrates.

In various embodiments, quantum circuit assemblies, e.g. the quantum circuit assembly 100, implementing with one or more RJJs as described herein, may be used to implement components associated with a quantum IC. Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

Josephson Junctions Fabricated Using Double-Angle Shadow Evaporation

In order to highlight the advantages offered by RJJs described herein, it would be helpful to first explain how Josephson Junctions are fabricated using double-angle shadow evaporation (also sometimes referred to as a "hanging resist" method) in conventional quantum circuits.

In summary, the name "double-angle shadow evaporation" reflects the fact that the method involves metal deposition, typically carried out by metal evaporation, at two different angles of incidence with respect to the substrate (hence, double-angle). The name further reflects the fact that metal deposition is performed through a hanging photoresist mask which casts a shadow on at least a part of the substrate, obscuring metal deposition on that part (hence, shadow evaporation/evaporation).

FIGS. 2A-2C provide a schematic illustration of one example of a photoresist mask 200 provided over a substrate 202 for fabricating Josephson Junctions using a double-angle shadow evaporation approach. Each of FIGS. 2A-2C provides a view of the same photoresist mask 200 over the substrate 202, but perspectives of these views are different. FIG. 2A provides a top down view (i.e. a view from a point above the substrate 202). FIG. 2B provides a cross-sectional view with a cross-section of the structure of FIG. 2A taken along a horizontal dashed line shown in FIG. 2A. Finally, FIG. 2C provides a cross-sectional view with a cross-section of the structure of FIG. 2A taken along a vertical dashed line shown in FIG. 2A. A legend provided within a dashed box at the bottom of FIGS. 2A-2C illustrates patterns used to indicate different elements shown in FIGS. 2A-2C, so that the FIGs are not cluttered by many reference numerals.

Josephson Junctions may be created by a double-angle shadow evaporation approach using a two-layer photoresist mask 200 that includes a bottom photoresist layer 204 and a top photoresist layer 206 as shown in FIGS. 2A-2C. The bottom layer 204 is undercut from the top layer 206 in that some portions of the top layer 206 hang, or are suspended, over the bottom layer 204. The bottom layer 204 is undercut in such a manner that the top layer 206 of photoresist forms a suspended bridge 208, known as a Dolan bridge, over a section of the substrate 202. Ways for fabricating such undercuts in photoresist are well known in the art of photolithographic processing and, therefore, are not described here in detail.

In order to form a Josephson Junction, metals are then deposited through the photoresist mask 200 with the suspended bridge. Conventionally, this is done as illustrated in FIGS. 3A-3C.

Each of FIGS. 3A-3C illustrates a result of different subsequent fabrication steps. FIG. 3C provides two views of the same structure. The view on the right side of FIG. 3C is a top down view (i.e. a view similar to that shown in FIG. 2A). The view on the left side of FIG. 3C is a cross-sectional view with a cross-section of the structure of FIG. 3C taken along a horizontal dashed line shown in FIG. 3C (i.e. a view similar to that shown in FIG. 2B). Each of FIGS. 3A and 3B only provide a cross-sectional view similar to that of the left side of FIG. 3C but at an earlier fabrication step. Similar to FIGS. 2A-2C, a legend provided within a dashed box at the bottom of FIGS. 3A-3C illustrates patterns used in the figures to indicate different elements shown in FIGS. 3A-3C. Moreover, similar reference numerals in FIGS. 2A-2C and FIGS. 3A-3C are used to illustrate analogous elements in the figures. For example, reference numerals 202 and 302, shown, respectively, in FIGS. 2 and 3 refer to a substrate, reference numerals 204 and 304—to a bottom mask layer, and so on. When provided with reference to one of the FIGS. 2A-2C and FIGS. 3A-3C, discussions of these elements are applicable to other figures, unless stated otherwise. Thus, in the interests of brevity, discussions of similar elements are not repeated for each of the figures but, rather, the differences between the figures are described.

As previously described herein, a Josephson Junction may include a thin layer of dielectric sandwiched between two layers of superconductors, the dielectric layer acting as the barrier in a superconducting tunnel junction. According to the double-angle shadow evaporation approach, such a device is conventionally fabricated by, first, depositing a layer of a first superconductor 310 on the substrate 302, as shown in FIG. 3A, through the two-layer mask such as e.g. the one shown in FIGS. 2A-2C. The first superconductor is deposited at an angle with respect to the substrate 302, as shown in FIG. 3A with an angle θ1. Slanted dotted-dashed lines in FIG. 3A illustrate the direction of deposition of the first superconductor 310. A layer of the first superconductor 310 may have a thickness between e.g. about 10 and 200 nanometers (nm), e.g. between about 30 and 100 nm.

The first superconductor 310 forms a bottom (base) electrode of the future Josephson Junction. A layer of insulator 311 (also referred to herein as a "dielectric layer 311" or a "dielectric 311"), shown in FIGS. 3B and 3C, is then provided over the first superconductor 310 to form a tunnel barrier of the future Josephson Junction. The tunnel barrier is formed by oxidizing the first superconductor 310, thus creating a layer of first superconductor oxide on its surface. Such an oxide may have a thickness between e.g. about 1 and 5 nm, typically for qubit applications between about 1 and 2 nm.

The fact that the choice of a tunnel barrier in a double-angle shadow evaporation method is constrained to an oxide of the base electrode superconductor limits the choice of the superconductor used as the first superconductor 310 in that the superconductor must be such that a controlled layer of oxide may be created on it. In practice, aluminum oxide is the only controlled oxide that may be formed from a metal. Therefore, currently aluminum is the only superconducting metal that is used for the base electrode of Josephson Junctions fabricated using the double-angle shadow evaporation technique.

After the layer of dielectric 311 is provided on the first superconductor 310, a second superconductor 312 is deposited through the mask but at a different angle with respect to the substrate 302 than θ1. FIG. 3B illustrates the second angle as an angle θ2 and slanted dotted-dashed lines in FIG. 3B illustrate the direction of deposition of the second superconductor 312. In some embodiments, the first and the second superconductors 310, 312 are deposited at the opposite angles, if measured with respect to a normal to the substrate 302. Conventionally, the second superconductor 320 is aluminum because the first superconductor must be aluminum, as described above. A layer of the second superconductor 312 may have a thickness between e.g. about 10 and 200 nm, typically between about 30 and 100 nm. The second superconductor 312 forms a counter electrode (i.e. counter to the bottom electrode formed by the first superconductor 310) of the future Josephson Junction, typically referred to as a "top" electrode.

The first and second superconductors 310, 312 are usually deposited using a non-conformal process, such as e.g. evaporative deposition. After deposition of the second superconductor 312, the deposition mask is removed, removing with it any first and/or second superconductor 310, 312 deposited on top of it.

In general, the above-described process of creating patterned structures of one or more target materials (in this case, structures made of the first and second superconductors 310, 312) on the surface of a substrate using a sacrificial material such as photoresist is referred to as a lift-off method. Lift-off is a type of an additive technique, as opposed to subtracting techniques like etching, and may be applied in cases where a direct etching of structural material would have undesirable effects on one or more layers below.

After the deposition mask is removed, the resulting Josephson Junction is left on the substrate 302 as shown in FIG. 3C as a Josephson Junction 314. The Josephson Junction 314 is formed by the small region of overlap under the photoresist bridge 308 (i.e. the area under the bridge 308 where the first superconductor 310, covered with a layer of a thin insulating material is overlapped by the second superconductor 312). Dimensions of the Josephson Junction 314 along x-axis and y-axis, shown in FIG. 3C as $d_x$ and $d_y$, respectively, are typically between about 50 and 1000 nm for any of $d_x$ and $d_y$.

As a result of performing the double-angle shadow evaporation as described above, junctions of the first and second superconductors may also form on each side of the Josephson Junction 314, such junctions shown in FIGS. 3B and 3C as junctions 316. However, because these junctions are of much larger dimensions than the Josephson Junction 314, e.g. measured several thousands of nm in the x-direction and hundreds of nm or more in the y-direction, they are essentially infinite for the Josephson effect to take place and, therefore, act as superconductors rather than Josephson Junctions.

One problem with the fabrication approach described above is that it includes steps which are not suitable for manufacturing on the larger wafer sizes used in the semiconductor industry. For example, angled metal deposition step does not produce a uniform film across the wafer and would prohibit uniform qubit performance across large area. Moreover, the fabrication approach described above relies on lift-off of metal films to produce wires remaining on the wafer. The lift-off technique is not amenable to the chemical waste systems of wafer cleaning tools and would not facilitate high volume manufacturing or even an extension to many qubits on a single wafer.

Another problem with the double-angle shadow evaporation approach is that the resulting Josephson Junction is surrounded by dielectric material on several sides. For example, as shown on the left side (i.e. cross-section) view of FIG. 3C indicating the boundaries of the Josephson Junction 314 with vertical dashed lines, the dielectric 311 that forms the tunnel barrier of the Josephson Junction 314 extends further, outside of the boundaries of the Josephson Junction 314, e.g. into the area 318 immediately adjacent to the Josephson Junction, because the dielectric 311 is provided across the entire bottom superconductor 310. The right side (i.e. top) view of FIG. 3C illustrates that the dielectric material 311 surrounds the Josephson Junction 314 on three of the four sides. As described above, one major source of loss, and thus decoherence in superconducting qubits are spurious TLS's, e.g. those caused by defects in the areas surrounding Josephson Junctions. Dielectrics surrounding the tunnel barriers and superconductors of Josephson Junctions, such as e.g. the dielectric portions 318 shown in FIG. 3C, may be one of the causes of spurious TLS's, leading to qubit decoherence.

RJJs disclosed herein may improve on at least some of the problems described above.

Resistive Josephson Junctions

Figure 4:
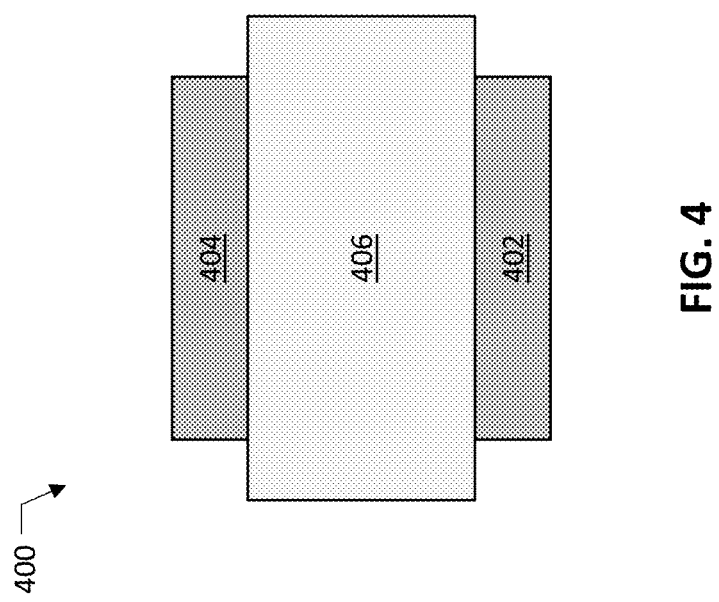
FIG. 4 is a cross-sectional side view of a resistive Josephson Junction (RJJ), in accordance with various embodiments of the present disclosure.

FIG. 4 is a cross-sectional side view of an RJJ 400, in accordance with various embodiments. The RJJ 400 may be implemented as any of the Josephson Junctions 104 of the quantum circuit assembly 100.

As shown in FIG. 4, an RJJ 400 includes a bottom electrode 402, a top electrode 404, and an RSL 406. The bottom electrode 402 is disposed between the RSL 406 and a substrate (not specifically shown in FIG. 4), and the RSL 406 is disposed between the bottom electrode 402 and the top electrode 404. The substrate may be any of the substrates described above. The components of the RJJ 400 are discussed in further detail below with reference to FIGS. 7A-7B.

Figure 5:
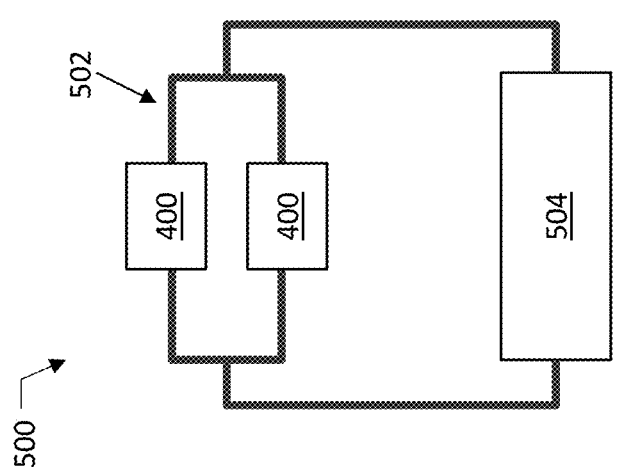
FIG. 5 is a schematic illustration of two RJJs electrically coupled to a shunt capacitor, in accordance with various embodiments of the present disclosure.

FIG. 5 is a schematic illustration of a quantum circuit assembly 500 that includes a SQUID 502 implementing two RJJs 400 connected in a superconductive loop, where the RJJs 400 are further connected in electrical parallel to a capacitor 504 (i.e. the shunt capacitor of a superconducting qubit). In the schematic illustration of FIG. 5, the thick lines between various ones of the RJJs 400 and the capacitor 504 illustrate electrically conductive, e.g. superconductive, connections; e.g. the thick lines forming a closed contour connecting the two RJJs 400 shown in FIG. 5 represent a superconductive loop of the SQUID 502. The quantum circuit assembly 500 may be an example of the quantum circuit assembly 100 described above, where the RJJs 400 are examples of Josephson Junctions 104 of a single qubit 102, and the shunt capacitor 504 is an example of the circuit element 104 of that qubit 102. Thus, descriptions of the quantum circuit assembly 100 are applicable to the quantum circuit assembly 500 shown in FIG. 5.

The bottom electrode 402 of each of the RJJs 400 may be electrically coupled to a first electrode of the capacitor 504, while the top electrode 404 may be electrically coupled to a second electrode of the capacitor 504. In some embodiments, the bottom electrodes 402 may be electrically coupled to the first electrode of the capacitor 504 via intermediate conductive traces/interconnects; and, similarly, top electrodes 404 may be electrically coupled to the second electrode of the capacitor 504 via intermediate conductive traces/interconnects. In other embodiments, the SQUID 502 may be implemented by providing two RJs 400 between the first and second plates of the capacitor 504. Such an embodiment is shown in FIG. 6 illustrating a quantum circuit assembly 600, which may be an example of the quantum circuit assembly 500, where a shunt capacitor 606 is implemented as a vertically-stacked parallel-plate capacitor provided over a substrate 608. As shown in FIG. 6, the capacitor 606 is a vertically-stacked parallel-plate capacitor having a bottom plate (i.e. a first electrode) 602 and a top plate (i.e. a second electrode) 604 separated by a dielectric medium (e.g. air, vacuum, any combination of gasses, or a solid dielectric medium). The RJJs 400 may then be provided between the bottom plate 602 and the top plate 604 of the shunt capacitor. In particular, as shown in FIG. 6, the bottom plate 602 of the shunt capacitor 606 may be electrically coupled to the bottom electrode 402 of each of the RJJs 400, while the top plate 604 of the shunt capacitor 606 may be electrically coupled to the top electrode 404 of each of the RJJs 400. Each of the bottom plate 602 and the top plate 604 may be formed of a superconductive material, e.g. any of the superconductors described above, and the RJJs 400 are connected in electrical parallel to the vertically-stacked parallel-plate shunt capacitor 606. The substrate 610 may be any of the substrates described above.

Various Layers Between Electrodes of Resistive Josephson Junctions

FIG. 7A is a cross-sectional side view illustrating various layers that may be included in the RJJ 400, in accordance with some embodiments of the present disclosure. As shown in FIG. 7A, in some embodiments, the RSL 406 may include an oxide layer 408 and an oxygen exchange layer (OEL) 410. The bottom electrode 402 may be disposed between the oxide layer 408 and a substrate (not specifically shown in FIG. 7A), the oxide layer 408 may be disposed between the OEL 410 and the bottom electrode 402, and the OEL 410 may be disposed between the oxide layer 408 and the top electrode 404.

An amply negative voltage applied to the RJJ 400 may cause oxygen atoms in the oxide layer 408 to migrate toward the OEL 410, leaving oxygen vacancies in the oxide layer 408. These oxygen vacancies may form one or more filaments that provide conductive pathways between the bottom electrode 402 and the top electrode 404, bringing the RJJ 400 into its LRS. This initial formation of such a filament in the RJJ 400 (e.g., after or during manufacture) may be referred to as "breakdown," and subsequent driving of the RJJ 400 into the LRS may be referred to as SET (with an associated SET voltage). The SET voltage may be less than the breakdown, or formation voltage. In some embodiments, a quantum circuit assembly implementing the RJJ 400 may include one or more additional circuit elements, e.g. a transistor (not specifically shown in the figures) that may assist during breakdown by limiting the current flow during breakdown to avoid overdriving the RJJ 400.

Once in the LRS, an amply positive voltage applied to the RJJ 400 may reduce the filaments until they no longer provide an electrical bridge between the bottom electrode 402 and the top electrode 404, bringing the RJJ 400 into its HRS. Driving the RJJ 400 into the HRS may be referred to as RESET (with an associated RESET voltage). Adjusting the amount of breakdown current may adjust the "width" of the filaments formed in the RJJ 400, with wider filaments providing more stable SET operation (potentially slowing the switching from SET to RESET) and narrower filaments providing less stable SET operation (potentially speeding up the switching from SET to RESET).

In the embodiment illustrated in FIG. 7A, the bottom electrode 402 and the top electrode 404 are shown as having smaller footprints than the OEL 410 and the oxide layer 408; such an arrangement may focus the areas of filament formation in the bulk of the oxide layer 408, rather than at the edges (where non-idealities may occur). In some embodiments, only the top electrode 404 has such a smaller footprint; in other embodiments, neither the top electrode 404 nor the bottom electrode 402 has a smaller footprint.

The bottom electrode 402 and the top electrode 404 of the RJJ 400 may be formed of metal. For example, in some embodiments, the bottom electrode 402 and the top electrode 404 may be formed of any of superconductors described above. The bottom electrode 402 may have a thickness 442 that may take any suitable value. For example, the thickness 442 may be between about 15 and 20 nanometers, including all values and ranges therein. The thickness 444 of the top electrode 404 may take the form of any of the embodiments of the thickness 442 of the bottom electrode 402. In some embodiments, the bottom electrode 402 and/or the top electrode 404 may be formed by physical vapor deposition (PVD) (e.g., sputtering). In some embodiments, the bottom electrode 402 may be formed by PVD, and the top electrode 404 may be formed by atomic layer deposition (ALD).

The oxide layer 408 may include any suitable oxide material. For example, the oxide layer 408 may be formed of hafnium oxide. The hafnium oxide may be represented as $HfO_x$, where x may be less than or equal to 2. In embodiments in which the oxide layer 408 is formed of hafnium oxide provided by ALD, x may be equal to 2, i.e., the oxide layer 408 may be $HfO_2$. In embodiments in which x is less than 2, the hafnium oxide may be referred to as sub-stoichiometric, as known in the art. In embodiments in which the oxide layer 408 is formed of hafnium oxide provided by PVD (e.g., sputtering), the oxygen content of an oxide layer 408 formed by PVD may be adjusted by controlling the rate of flow of oxygen during the PVD process. A PVD-deposited material may not be fully stoichiometric, and thus sub-stoichiometry of a material may be a hallmark of a PVD process (versus, e.g., an ALD process). More generally, the oxide layer 408 may be formed of any metal oxide, such as zirconium oxide, tantalum oxide, indium oxide, silicon oxide, aluminum oxide, or titanium oxide. The oxide layer 408 may have a thickness 448 that may take any suitable value. For example, the thickness 448 may be between about 1 and 100 nanometers, including all values and ranges therein, e.g., between about 1 and 50 nanometers, or between about 3 and 10 nanometers.

In the RJJ 400 of FIG. 7A, the OEL 410 may be provided by an oxygen exchange (OE) portion 412 and a spacer 414. The spacer 414 may be disposed between the OE portion 412 and the oxide layer 408, and thus may space the OE portion 412 from the oxide layer 408. In some embodiments, the OE portion 412 may be formed of any reactive metal, such as hafnium, titanium, zirconium, aluminum, erbium, iridium, or tantalum. The OE portion 412 may have a thickness 452 that may take any suitable value. For example, the thickness 452 may be between about 1 and 15 nanometers, including all values and ranges therein, e.g., between about 2 and 5 nanometers.

In some embodiments, the spacer 414 may be formed of an oxynitride material, such as silicon oxynitride, a carbon-doped oxynitride, or hafnium oxynitride. The reactive OE portion 412 may scavenge some of the oxygen from the spacer 414, forming oxygen vacancies in the spacer 414 that can be used to form the electrically conductive filaments discussed above. In some embodiments, the spacer 414 may be formed by depositing (e.g., by PVD) an initial spacer material, then annealing the initial spacer material to drive oxygen from the oxide layer 408 into the initial spacer material, forming the spacer 414. In some embodiments, hafnium oxynitride may be a particularly advantageous material for use as the spacer 414 because it acts as an effective oxygen barrier at low temperatures (e.g., temperatures below 500-600 degrees Celsius) and accepts oxygen at higher temperature (e.g., anneal temperatures). The spacer 414 may have a thickness 454 that may take any suitable value. For example, the thickness 454 may be between about 10 angstroms and 50 nanometers, including all values and ranges therein, e.g., between about 1 and 5 nanometers, or between 2 and 3 nanometers.

Any suitable combination of the materials discussed above may be included in an RJJ 400 shown in FIG. 7A. For example, in some embodiments, the bottom electrode 402 may be titanium nitride (formed by, e.g., PVD), the OE portion 412 may be hafnium (formed by, e.g., PVD), the spacer 414 may be hafnium oxynitride (formed by, e.g., PVD), the oxide layer 408 may be hafnium oxide (formed by, e.g., ALD), and the top electrode 404 may be titanium nitride (formed by, e.g., ALD).

Figure 7B:
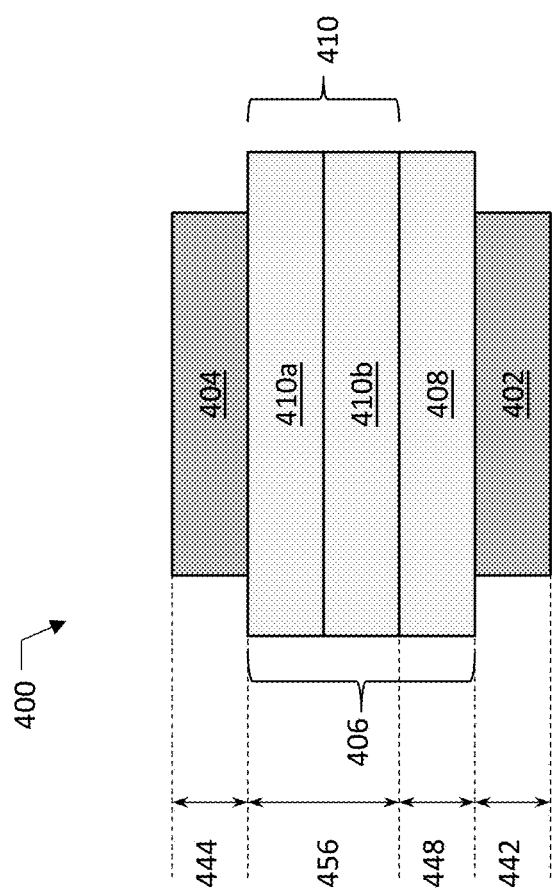

FIG. 7B is an alternative to the embodiment shown in FIG. 7A. FIG. 7B also provides a cross-sectional side view illustrating various layers that may be included in the RJJ 400, in accordance with some embodiments of the present disclosure. Elements labeled in FIG. 7B with the same reference numerals are intended to represent analogous elements to those shown in FIG. 7A. In the interests of brevity, their descriptions provided with reference to FIG. 7A are not repeated to FIG. 7B and, instead, only differences between these two figures are described.

In the RJJ 400 of FIG. 7B, the OEL 410 may be provided as a stack of one or more OE portions formed by PVD. In FIG. 7B, the OEL 410 is represented as a stack of two OE portions, a first OE portion 410a and a second OE portion 410b. The second OE portion 410b may be disposed between the first OE portion 410a and the oxide layer 408. Generally, the PVD materials in the OEL 410 may be more oxygen reactive than the material in the oxide layer 408, and may be reactive so as to scavenge oxygen from the oxide layer 408 as part of forming a filament of oxygen vacancies. By forming the OEL 410 and the oxide layer 408 in the same PVD chamber, the oxygen reactive materials of the OEL 410 may not be exposed to air as they typically would be when the OEL 410 is formed by PVD and the oxide layer 408 is formed by ALD (in a different chamber).

In some embodiments in which the OEL 410 includes multiple OE portions (e.g., the first OE portion 410a and the second OE portion 410b), the oxygen content of the different OE portions may provide a stepped gradient from the top electrode 404 to the oxide layer 408 so that the oxygen content of the OE portion closest to the oxide layer 408 has a higher oxygen content than the OE portion closest to the top electrode 404. For example, in the two-layer embodiment illustrated in FIG. 7B, the first OE portion 410a may be $HfO_{y1}$, the second OE portion 410b may be $HfO_{y2}$, and the oxide layer 408 may be $HfO_x$, where $0 \leq y1 < y2 < x \leq 2$. More generally, for an n-layer OEL 410, the OE portions 1, ..., n (where the portion 1 is closest to the bottom electrode 402 and the portion n is closest to the oxide layer 408), the oxygen contents y1, ..., yn may be $0 \leq y1 < ... < yn \leq 2$.

In other embodiments in which the OEL 410 includes multiple material layers (e.g., the first OE portion 410a and the second OE portion 410b), the oxygen content of one or more of the OE portions may itself have a gradient between the bottom and top surfaces of the OE portion (e.g., increasing oxygen content from bottom to top). For example, the first OE portion 410a and/or the second OE portion 410b may itself include an oxygen content gradient. As noted above, such a gradient could be achieved within a single material during PVD by controlling the rate of oxygen flow.

In some embodiments, the OEL 410 may include only a single OE portion (e.g., the first OE portion 410a) and the second OE portion 410b may be omitted. In some such embodiments, the OEL 410 may be formed of a material that is more oxygen reactive than the oxide layer 408. For example, the OEL 410 may be formed of $HfO_p$, the oxide layer may have an oxygen content of $HfO_x$, where $0 \leq p < x \leq 2$. In some embodiments in which the OEL 410 includes a single OE portion, that single OE portion may itself have an oxygen gradient, as discussed above.

Any suitable materials may be included in the OEL 410 shown in FIG. 7B. In some embodiments, the OEL 410 shown in FIG. 7B may be formed of any reactive metal, such as hafnium, titanium, zirconium, aluminum, erbium, iridium, or tantalum (or oxides thereof). The OEL 410 may have a thickness 456 that may take any suitable value. For example, the thickness 456 may be between about 1 and 15 nanometers, including all values and ranges therein, e.g., between about 2 and 6 nanometers.

Any suitable combination of the materials discussed above may be included in an RJJ 400 shown in FIG. 7B. For example, in some embodiments, the bottom electrode 402 may be titanium nitride (formed by, e.g., PVD), the OEL 410 may be $HfO_y$ with $0 \leq y < 2$ (formed by, e.g., PVD), the oxide layer 408 may be $HfO_2$ (formed by PVD), and the top electrode 404 may be titanium nitride (formed by, e.g., PVD). In some embodiments, the bottom electrode 402 may be titanium nitride (formed by, e.g., PVD), the first OE portion 410a may be hafnium (formed by, e.g., PVD), the second OE portion 410b may be $HfO_y$ with $0 \leq y < 2$ (formed by, e.g., PVD), the oxide layer 408 may be $HfO_2$ (formed by, e.g., PVD), and the top electrode 404 may be titanium nitride (formed by, e.g., PVD).

Although FIGS. 7A and 7B illustrate the oxide layer 408 to be below the OEL 410, i.e., between the OEL 410 and the bottom electrode 402, in other embodiments, the oxide layer 408 may be provided above the OEL 410, i.e., between the OEL 410 and the top electrode 404. Descriptions provided above may then be easily adapted to such embodiments, all of which being within the scope of the present disclosure.

Figure 8:
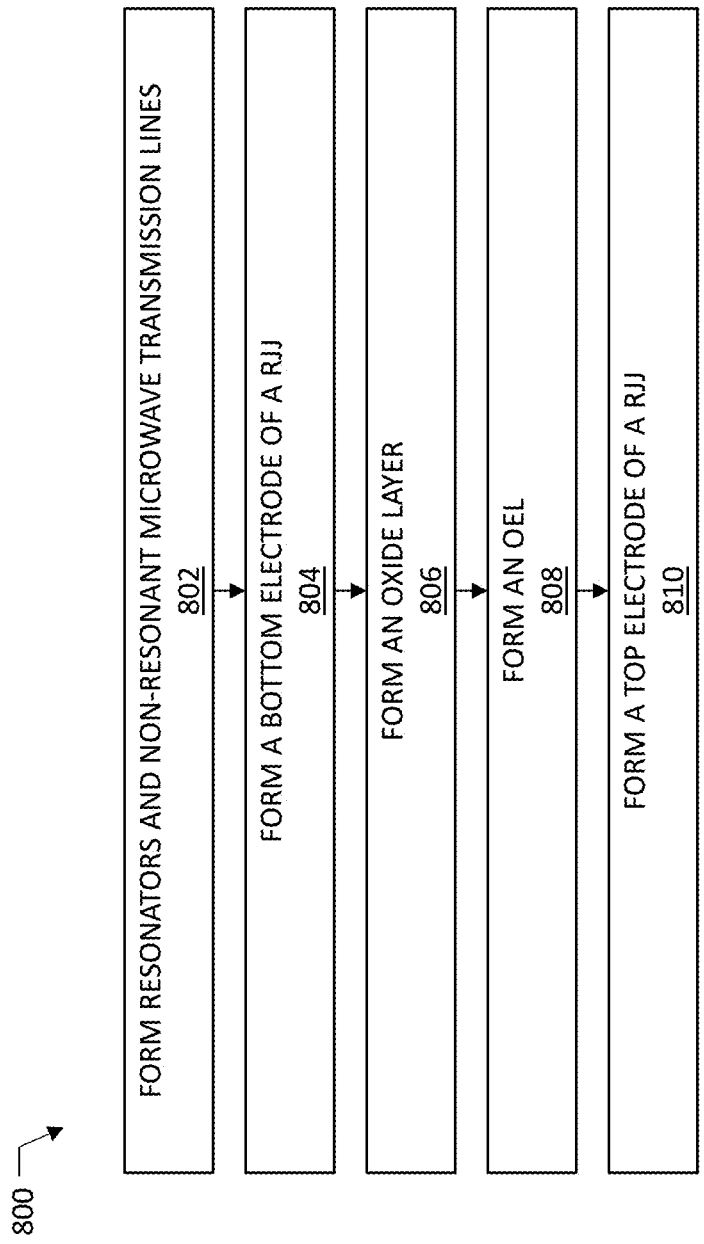
FIG. 8 provides a flow chart of a method for fabricating a quantum circuit assembly with one or more RJJs, according to some embodiments of the present disclosure.

Manufacturing a Quantum Circuit Assembly with One or More Resistive Josephson Junctions FIG. 8 provides a flow chart of a method for fabricating a quantum circuit assembly with one or more RJJs, according to some embodiments of the present disclosure.

Although the operations of the method 800 are illustrated in FIG. 8 once each and in a particular order, the operations may be performed in any suitable order and repeated as desired. For example, one or more operations may be performed in parallel to manufacture multiple quantum circuit assemblies as described herein substantially simultaneously. In another example, the operations may be performed in a different order to reflect the architecture of a particular quantum circuit component in which one or more quantum circuit assemblies with one or more RJJs are to be included.

In addition, the example manufacturing method 800 may include other operations not specifically shown in FIG. 8, such as e.g. various cleaning or planarization operations as known in the art. For example, in some embodiments, the substrate may be cleaned prior to or/and after any of the processes of the method 800 described herein, e.g. to remove surface-bound organic and metallic contaminants, as well as subsurface contamination. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In another examples, the structures/assemblies described herein may be planarized prior to or/and after any of the processes of the method 800 described herein, e.g. to remove overburden or excess materials. In some embodiments, planarization may be carried out using either wet or dry planarization processes, e.g. planarization be a chemical mechanical planarization (CMP), which may be understood as a process that utilizes a polishing surface, an abrasive and a slurry to remove the overburden and planarize the surface.

The method 800 may begin with forming, over or at least partially in a substrate, various resonators and non-resonant microwave transmission lines for the future quantum circuit assembly (process 802 shown in FIG. 8). In various embodiments, the resonators and non-resonant transmission lines formed in the process 802 may include any of the resonators 110 and any of the non-resonant transmission lines 108 described above. For example, the process 802 may include forming one or more of a flux bias line, a direct drive line, a readout resonator, and a coupling resonator for each qubit to be included in a quantum circuit assembly. These elements may be formed from any suitable electrically conductive, preferably superconductive, material, e.g. any of Al, Nb, NbN, NbTiN, TiN, MoRe, etc., or any alloy of two or more superconducting/conducting materials. In some embodiments, the process 802 may also include forming other portions of the future quantum circuit assembly that are to be formed of such materials, e.g. some circuit elements 106 such as superconducting loops of any SQUIDs to be included in the assembly, or other circuit elements 106.

In various embodiments, any suitable deposition and patterning techniques may be used for providing the superconductive elements of the quantum circuit assembly in the process 802. Examples of deposition techniques for depositing a layer of a superconductive material for forming these elements in the process 802 include ALD, PVD (e.g. evaporative deposition, magnetron sputtering, or e-beam deposition), chemical vapor deposition (CVD), or electroplating. Examples of patterning techniques that may also be used in the process 802 include photolithographic or electron-beam (e-beam) patterning, possibly in conjunction with a dry etch, such as e.g. radio frequency (RF) reactive ion etch (RIE) or inductively coupled plasma (ICP) RIE, to pattern the layer of a superconductive material into the resonators and non-resonant transmission lines (and whatever other superconductive elements are to be provided in the process 802) of the specified geometries for a given implementation. In general, any suitable patterning techniques may be used to control the shape of the components of the quantum circuit assembly 100 during manufacture (e.g., semi-additive techniques, subtractive techniques, or other techniques).

Next, the method 800 may proceed with forming, for each qubit to be included in a quantum circuit assembly, a SQUID that includes one or more Josephson Junctions, at least one of which is implemented as any of the RJJs described herein. To that end, the method 800 may include forming a bottom electrode of a RJJ in process 804 shown in FIG. 8, forming an oxide layer in process 806 shown in FIG. 8, forming an OEL in process 808 shown in FIG. 8, and forming a top electrode of the RJJ in process 810 shown in FIG. 8.

The bottom electrode formed in the process 804 may take any of the forms disclosed herein, e.g. the bottom electrode 402. The bottom electrode 402 may be formed as part of an interconnect layer or may be formed as part of forming superconductive components in the process 802. In some embodiments, the bottom electrode 402 may be formed by PVD (e.g., sputtering).

The oxide layer formed in the process 806 may take any of the forms disclosed herein, e.g. the oxide layer 408 of any of the embodiments of the RJJ 400 described herein. In some embodiments, the oxide layer 408 may be formed by oxidizing the upper-most layer of the bottom electrode 402. In other embodiments, the oxide layer 408 may be formed by ALD.

The OEL formed in the process 808 may take any of the forms disclosed herein, e.g. the OEL 410 including the OEL portion 412 and the spacer 414 as shown in FIG. 7A, or the OEL 410 including the first OEL portion 410a and the second OEL portion 410b as shown in FIG. 7B. In the embodiments where the OEL 410 is as shown in FIG. 7A, the process 808 may include, first, forming the spacer 414 over the oxide layer 408, and then forming the OEL portion 412 over the spacer 414. As discussed above, the spacer material may be a nitride material, such as silicon nitride, a carbon-doped nitride, or hafnium nitride. In some embodiments, the spacer 414 may be formed by PVD. The OE portion 412 may also be formed by PVD. In some embodiments, the OE portion 412 may be formed in the same PVD chamber as the spacer 414. In the embodiments where the OEL 410 is as shown in FIG. 7B, the process 808 may include, first, forming the second OEL portion 410b over the oxide layer 408, and then forming the first OEL portion 410a over the second OEL portion 410b. Each of the first and second OEL portions 410a, 410b may be formed by PVD, and, in some embodiments, may be formed in the same PVD chamber, without exposing the assembly to an air break (and thus without exposing the second OEL portion 410b to an air break that could result in oxidation of the second OEL portion 410b).

The top electrode formed in the process 810 may take any of the forms disclosed herein, e.g. the top electrode 404. In some embodiments, the top electrode 404 may be formed by PVD (e.g., sputtering). In some embodiments, the top electrode 404 may be formed in the same PVD chamber as the OEL portion 412 in case the RJJ as shown in FIG. 7A is being implemented, or in the same PVD chamber as the first OEL portion 410a in case the RJJ as shown in FIG. 7A is being implemented, without exposing the assembly to an air break (and thus without exposing the OEL 410 to an air break that could result in oxidation of the OEL 410). In the final RJJ, a distance between the bottom electrode 402 and the top electrode 404 may be between 1 and 20 nanometers, including all values and ranges therein, e.g. between about 2 and 10 nanometers.

As described above, although FIGS. 7A and 7B illustrate the oxide layer 408 to be below the OEL 410, i.e., between the OEL 410 and the bottom electrode 402, in other embodiments, the oxide layer 408 may be provided above the OEL 410, i.e., between the OEL 410 and the top electrode 404. In such embodiments, the order of the processes 806 and 808 would be reversed, i.e. the OEL 410 would be provided over the bottom electrode formed in the process 804, and then the oxide layer 408 would be provided over the OEL 410. In some such embodiments, the oxide layer 408 may be provided by PVD, in particular, in the same PVD chamber as the OEL 410 without exposing the assembly to an air break (and thus without exposing the OEL 410 to an air break that could result in oxidation of the OEL 410).

Figure 9:
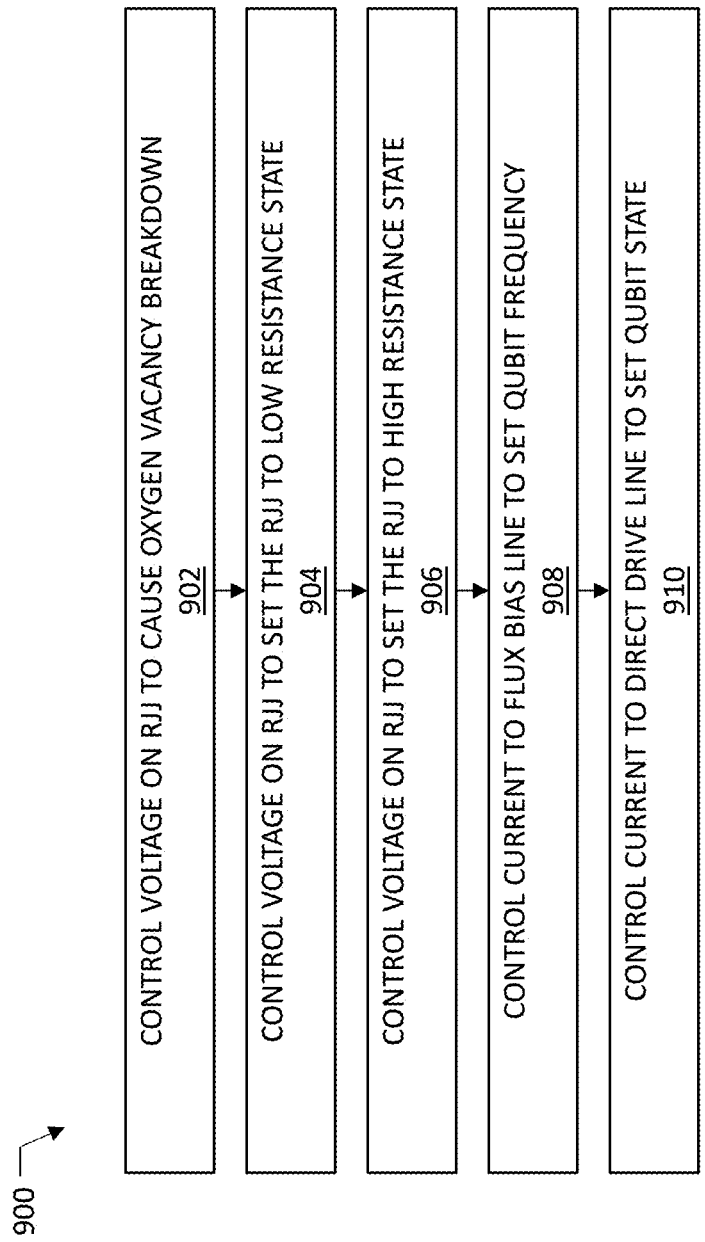
FIG. 9 provides a flow chart of a method for operating a quantum circuit assembly with one or more RJJs, according to some embodiments of the present disclosure.

Operating a Quantum Circuit Assembly with One or More Resistive Josephson Junctions FIG. 9 provides a flow chart of a method 900 for operating a quantum circuit assembly with one or more RJJs, according to some embodiments of the present disclosure.

As shown in FIG. 9, the method 900 may begin with process 902 that includes controlling voltage on at least one RJJ included in a SQUID of the transmon qubit device to cause oxygen vacancy breakdown in the RJJ (a process sometimes referred to as "forming" because it results in formation of one or more filaments that provide conductive pathways between the bottom electrode 402 and the top electrode 404). The process 902 may include the breakdown process described above.

The method 900 may then proceed with process 904 that includes controlling voltage on the RJJ to set the RJJ to a LRS. The process 904 may include the SET process described above. The SET voltage applied to the RJJ in the process 904 may be less than the breakdown, or formation voltage applied to the RJJ in the process 902.

The method 900 may then proceed with process 906 that includes controlling voltage on the RJJ to set the RJJ to a HRS. The process 906 may include the RESET process described above. The RESET voltage applied to the RJJ in the process 906 may be of the opposite polarity than that applied in the process 904, in order to reduce the filaments until they no longer provide an electrical bridge between the bottom electrode 402 and the top electrode 404, bringing the RJJ 400 into its HRS.

By controlling how much voltage is applied in one or more of the processes 902, 904, 906, the resistance of the RJJ may be carefully controlled.

As also shown in FIG. 9, the method 900 may further include processes 908 and 910, the order of which may be reversed, or at least portions of which may be carried out substantially simultaneously. The process 908 includes controlling current to a flux bias line of the transmon qubit device to control a frequency of the transmon qubit device, while the process 910 includes controlling current to a direct drive line of the transmon qubit device to set a state of the transmon qubit device, each of which may be described in accordance with the principles of superconducting qubit operation described above.

Example Qubit Devices

In various embodiments, RJJs, e.g. the RJJ 400, described above, could be a part of a superconducting qubit, e.g. a part of a charge qubit, in particular a part of a transmon, or a part of a flux qubit. Quantum circuit assemblies/structures with RJJs as described above may be included in any kind of qubit devices or quantum processing devices/structures. Some examples of such devices/structures are illustrated in FIGS. 10A-10B, 11, and 12.

Figure 10B:
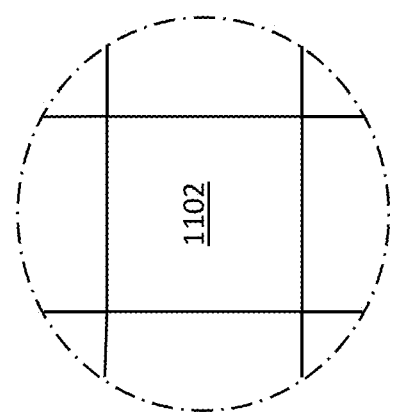
FIGS. 10A and 10B are top views of a wafer and dies that may include one or more of quantum circuit assemblies disclosed herein.
Figure 10A:
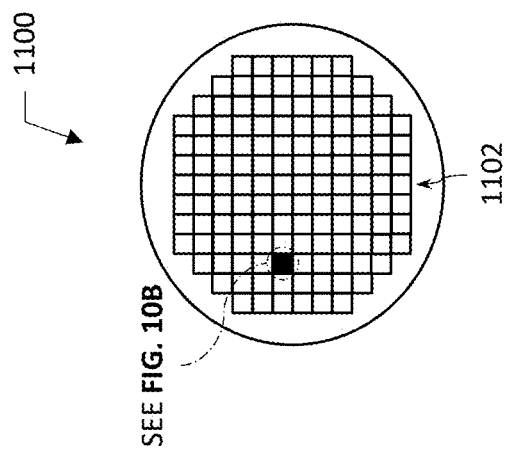

FIGS. 10A-10B are top views of a wafer 1100 and dies 1102 that may be formed from the wafer 1100, according to some embodiments of the present disclosure. The dies 1102 may include any of the quantum circuits with RJJs as disclosed herein, e.g., any of the RJJs 400 disclosed herein, possibly included in any of the quantum circuit assemblies described above, e.g. the quantum circuit assemblies 100, 500, or 600, or any further embodiments of such assemblies as described herein. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuit assemblies 100, including any Josephson Junctions fabricated using the air bridge/cantilever method described herein, as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 12) or other logic that is configured to store information in the memory devices or execute instructions stored in the memory array.

Figure 11:
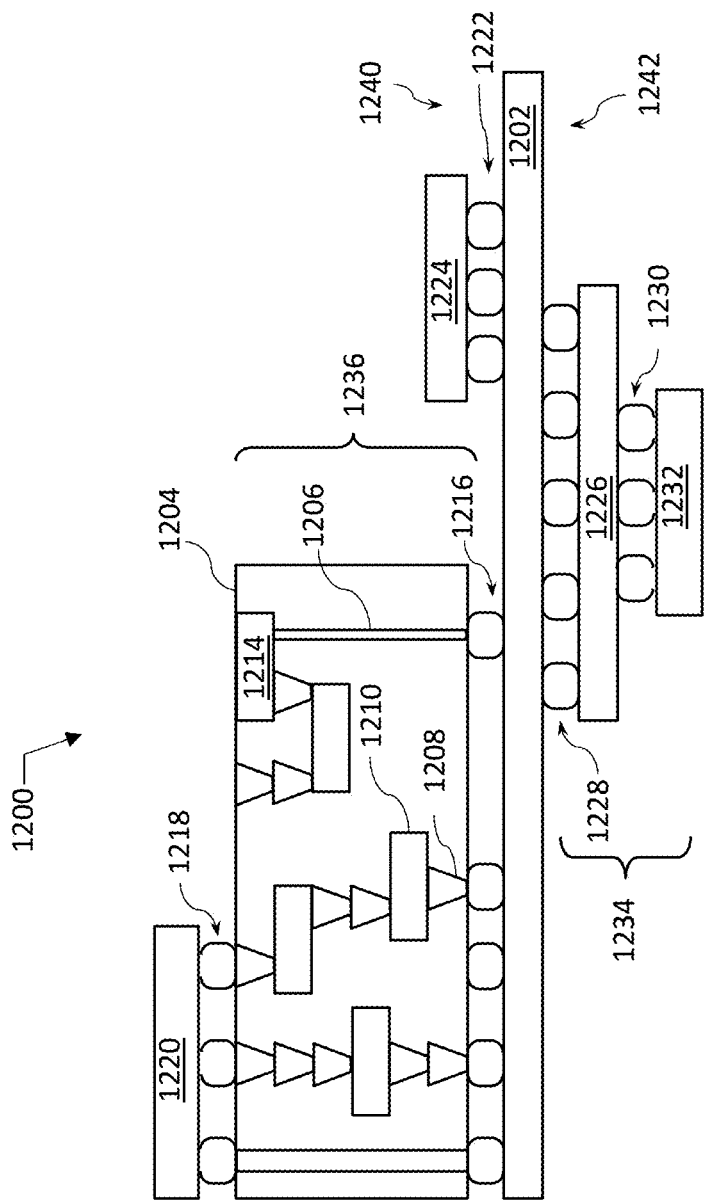
FIG. 11 is a cross-sectional side view of a device assembly that may include one or more of quantum circuit assemblies disclosed herein.

FIG. 11 is a cross-sectional side view of a device assembly 1200 that may include any of the embodiments of the quantum circuit assemblies disclosed herein, which assemblies may include any embodiments of the RJJ 400 described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. Signal transfer between components or layer may happen with both low resistance DC connections or by either in-plane or out-of-plane capacitive connections. In other embodiments, the circuit board 1202 may be a package substrate or flexible board.

The IC device assembly 1200 illustrated in FIG. 11 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 11), male and female portions of a socket, an adhesive, an underfill material, and/or any other suitable electrical and/or mechanical coupling structure. The coupling components 1216 may include other forms of electrical connections that may have no mechanical contact, such as parallel-plate capacitors or inductors, which can allow high-frequency connection between components without mechanical or DC connections.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 11, multiple packages may be coupled to the interposer 1204; indeed, additional interposers may be coupled to the interposer 1204. The interposer 1204 may provide an intervening substrate used to bridge the circuit board 1202 and the package 1220. In some embodiments, the package 1220 may be a quantum circuit device package as described herein, e.g. a package including any of the quantum circuits with RJJs as disclosed herein, e.g., any of the RJJs 400 disclosed herein, possibly included in any of the quantum circuit assemblies described above, e.g. the quantum circuit assemblies 100, 500, or 600, or any further embodiments of such assemblies as described herein. In other embodiments, the package 1220 may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 11, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of a crystalline material, such as silicon, germanium, or other semiconductors, an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1210 and vias 1208, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. In some embodiments, the package 1224 may be a package including one or more quantum circuits as described herein, e.g., a package including any of the quantum circuits with RJJs as disclosed herein, e.g., any of the RJJs 400 disclosed herein, possibly included in any of the quantum circuit assemblies described above, e.g. the quantum circuit assemblies 100, 500, or 600, or any further embodiments of such assemblies as described herein. In other embodiments, the package 1224 may be a conventional IC package.

The device assembly 1200 illustrated in FIG. 11 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example. In some embodiments, one or both of the packages 1226 and 1232 may include any of the quantum circuits with RJJs as disclosed herein, e.g., any of the RJJs 400 disclosed herein, possibly included in any of the quantum circuit assemblies described above, e.g. the quantum circuit assemblies 100, 500, or 600, or any further embodiments of such assemblies as described herein, or a combination thereof.

Figure 12:
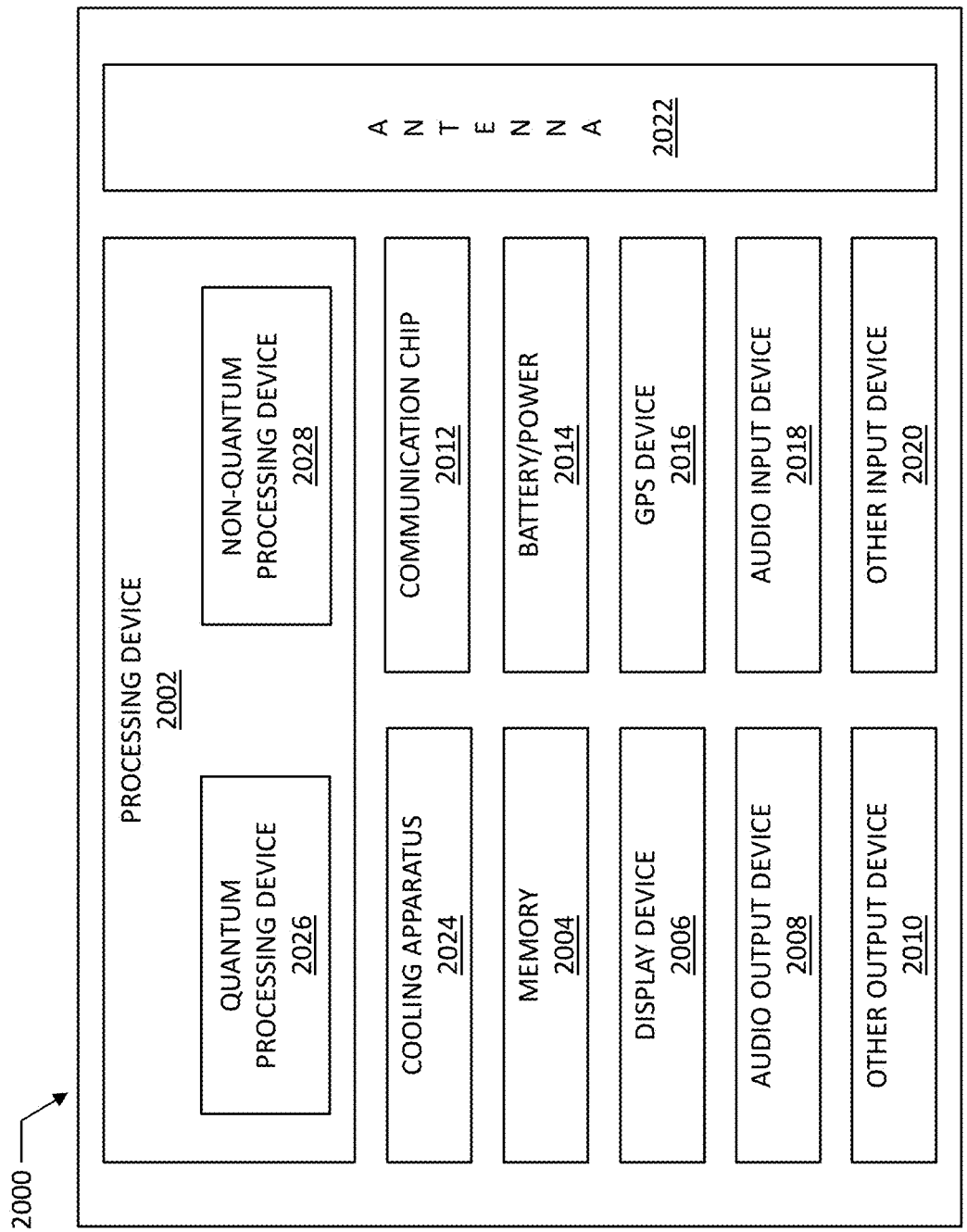
FIG. 12 is a block diagram of an example quantum computing device that may include one or more of quantum circuit assemblies disclosed herein, in accordance with various embodiments.

FIG. 12 is a block diagram of an example quantum computing device 2000 that may include any of the quantum circuits disclosed herein. A number of components are illustrated in FIG. 12 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 12, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled. In further examples, the quantum computing device 2000 may include a microwave input device or a microwave output device (not specifically shown in FIG. 11), or may include microwave input or output device interface circuitry (e.g., connectors and supporting circuitry) to which a microwave input device or microwave output device may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum circuits disclosed herein, e.g., any of the quantum circuits with RJJs as disclosed herein, e.g., any of the RJJs 400 disclosed herein, possibly included in any of the quantum circuit assemblies described above, e.g. the quantum circuit assemblies 100, 500, or 600, or any further embodiments of such assemblies as described herein, and may perform data processing by performing operations on the qubits that may be generated in the quantum circuit assemblies as described herein, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), non-volatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuit assemblies as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide examples of various ones of the embodiments disclosed herein.

Example 1 provides a quantum circuit assembly that includes a substrate and a SQUID that includes two Josephson Junctions coupled (electrically connected) to a superconductive loop, where at least one of the two Josephson Junctions is an RJJ. The RJJ includes a bottom electrode, a top electrode, and an RSL, where the bottom electrode is disposed between the RSL and the substrate, and the RSL is disposed between the bottom electrode and the top electrode.

Example 2 provides the quantum circuit assembly according to example 1, where the RSL includes an oxide layer and an OEL, where the bottom electrode is disposed between the oxide layer and the substrate, and the oxide layer is disposed between the OEL and the bottom electrode.

Example 3 provides the quantum circuit assembly according to example 3, where the RSL further includes a spacer disposed between the OEL and the oxide layer.

Example 4 provides the quantum circuit assembly according to example 3, where the spacer is a nitride material.

Example 5 provides the quantum circuit assembly according to example 4, where the spacer includes hafnium.

Example 6 provides the quantum circuit assembly according to example 3, where the spacer includes oxygen.

Example 7 provides the quantum circuit assembly according to any one of examples 2-6, where the OEL includes hafnium.

Example 8 provides the quantum circuit assembly according to any one of examples 2-7, where the OEL includes multiple sub-layers having different material compositions.

Example 9 provides the quantum circuit assembly according to example 8, where each of the sub-layers includes hafnium or hafnium oxide.

Example 10 provides the quantum circuit assembly according to example 8, where the OEL has a stepped gradient of oxygen content between the top electrode and the oxide layer.

Example 11 provides the quantum circuit assembly according to any one of examples 2-10, where the OEL has a gradient of oxygen content between the top electrode and the oxide layer.

Example 12 provides the quantum circuit assembly according to any one of examples 2-11, where the oxide layer is a sub-stoichiometric oxide layer.

Example 13 provides the quantum circuit assembly according to any one of examples 2-12, where the oxide layer includes hafnium oxide.

Example 14 provides the quantum circuit assembly according to any one of examples 2-13, where the oxide layer has an oxygen content gradient that decreases toward the OEL.

Example 15 provides the quantum circuit assembly according to any one of the preceding examples, where each of the bottom electrode and the top electrode includes a superconductive material.

Example 16 provides the quantum circuit assembly according to any one of the preceding examples, where a distance between the bottom electrode and the top electrode is between 1 and 20 nanometers, including all values and ranges therein, e.g. between about 2 and 10 nanometers.

Example 17 provides the quantum circuit assembly according to any one of the preceding examples, where the SQUID is a part of a transmon qubit device of the quantum circuit assembly.

Example 18 provides the quantum circuit assembly according to example 17, further including a flux bias line, configured to control a frequency of the transmon qubit device by e.g. providing electromagnetic fields which couple to the Josephson Junctions of the SQUID.

Example 19 provides the quantum circuit assembly according to examples 17 or 18, further including a readout resonator, configured to detect (readout) a state of the transmon qubit device by capacitively coupling, during operation of the quantum circuit assembly, to a portion of the transmon qubit device.

Example 20 provides the quantum circuit assembly according to any one of examples 17-19, further including a direct drive line, configured to set a state of the transmon qubit device by capacitively coupling, during operation of the quantum circuit assembly, to a portion of the transmon qubit device.

Example 21 provides the quantum circuit assembly according to any one of examples 17-20, further including one or more coupling components configured to couple the transmon qubit device to one or more further transmon qubit devices.

Example 22 provides the quantum circuit assembly according to example 21, where the one or more coupling components include one or more coupling resonators.

In further examples, each of one or more of "further transmon qubit devices" of the quantum circuit assembly according to examples 21 or 22 may be implemented as the qubit device of the quantum circuit assembly according to any one of examples 1-22.

Example 23 provides the quantum circuit assembly according to any one of the preceding examples, further including a capacitor coupled in electrical parallel to the SQUID (i.e. the capacitor is a shunt capacitor).

Example 24 provides a method of manufacturing a quantum circuit assembly, the method including forming one or more of a flux bias line, a direct drive line, a readout resonator, and a coupling resonator; forming a SQUID that includes two Josephson Junctions coupled (electrically connected) to a superconductive loop. Forming at least one of the two Josephson Junctions includes forming a bottom electrode over the substrate, the bottom electrode including a superconductive material, after forming the bottom electrode, forming an oxide layer on the bottom electrode, and after forming the oxide layer on the bottom electrode, forming an OEL on the oxide layer.

Example 25 provides the method according to example 24, where forming the OEL includes PVD of the OEL.

Example 26 provides the method according to examples 24 or 25, where forming the oxide layer includes ALD of the oxide layer.

Example 27 provides a method of operating a transmon qubit device, the method including controlling voltage applied to a RJJ included in a SQUID of the transmon qubit device to cause oxygen vacancy breakdown in the RJJ; controlling voltage applied to the RJJ to set the RJJ to a LRS; and controlling voltage applied to the RJJ to set the RJJ to a HRS.

Example 28 provides the method according to example 27, further including controlling current to a flux bias line of the transmon qubit device to control a frequency of the transmon qubit device.

Example 29 provides the method according to examples 27 or 28, further including controlling current to a direct drive line of the transmon qubit device to set a state of the transmon qubit device.

Example 30 provides the method according to any one of examples 27-29, where the SQUID is included in a quantum circuit assembly according to any one of the preceding examples (e.g. any one of examples 1-23).

Example 31 provides a quantum IC package that includes a qubit die and a further IC element coupled to the qubit die. The qubit die includes one or more qubit devices, each qubit device including at least one non-linear inductive element (e.g. a Josephson Junction) including a resistive switching material disposed between a first electrode and a second electrode.

Example 32 provides the quantum IC package according to example 31, where the further IC element is coupled to the qubit die via one or more interconnects between the further IC element and the qubit die.

Example 33 provides the quantum IC package according to examples 31 or 32, where the further IC element is one of an interposer, a circuit board, a flexible board, or a package substrate.

In various further examples, the non-linear inductive element of the qubit devices of the quantum IC package according to any one of examples 31-33 is the at least one Josephson Junction of a SQUID of a quantum circuit assembly according to any one of the preceding examples (e.g. examples 1-23).

Example 34 provides a quantum computing device that includes a quantum processing device and a memory device configured to store data generated by the plurality of qubit devices during operation of the quantum processing device. The quantum processing device includes a plurality of qubit devices provided over a substrate, each qubit device including a SQUID that includes two Josephson Junctions coupled (electrically connected) to a superconductive loop, where at least one of the two Josephson Junctions includes a tunnel barrier including a resistive switching material.

Example 35 provides the quantum computing device according to example 34, further including a cooling apparatus configured to maintain a temperature of the quantum processing device below 5 degrees Kelvin.

Example 36 provides the quantum computing device according to examples 34 or 35, where the memory device is configured to store instructions for a quantum computing algorithm to be executed by the quantum processing device.

Example 37 provides the quantum computing device according to any one of examples 34-36, further including a non-quantum processing device coupled to the quantum processing device.

In various further examples, at least some of the plurality of qubit devices of the quantum computing device according to any one of examples 34-37 are implemented as the quantum circuit assembly according to any one of the preceding examples (e.g. examples 1-23). In still further examples, the quantum computing device according to any one of examples 34-37 includes the quantum IC package according to any one of the preceding examples (e.g. examples 31-33).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly, comprising:
a superconducting quantum interference device (SQUID), the SQUID including two Josephson Junctions coupled to a superconductive loop, where at least one of the two Josephson Junctions includes a first electrode, a second electrode, and a resistive switching material (RSM) between the first electrode and the second electrode,
where the RSM includes an oxide material and an oxygen exchange material (OEM), and the oxide material is between the OEM and the first electrode.

2. The quantum circuit assembly according to claim 1, wherein the RSM further includes:
a spacer between the OEM and the oxide material.

3. The quantum circuit assembly according to claim 2, wherein the spacer is a nitride material.

4. The quantum circuit assembly according to claim 3, wherein the spacer includes hafnium.

5. The quantum circuit assembly according to claim 1, wherein the OEM includes hafnium.

6. The quantum circuit assembly according to claim 1, wherein the OEM includes multiple layers of materials having different material compositions.

7. The quantum circuit assembly according to claim 6, wherein each of the multiple layers includes hafnium or hafnium and oxygen.

8. The quantum circuit assembly according to claim 6, wherein the OEM has a stepped gradient of oxygen content between the second electrode and the oxide material.

9. The quantum circuit assembly according to claim 1, wherein the OEM has a gradient of oxygen content between the second electrode and the oxide material.

10. The quantum circuit assembly according to claim 1, wherein the oxide material is a sub-stoichiometric oxide material.

11. The quantum circuit assembly according to claim 1, wherein the oxide material includes hafnium and oxygen.

12. The quantum circuit assembly according to claim 1, wherein the oxide material has an oxygen content gradient that decreases toward the OEM.

13. The quantum circuit assembly according to claim 1, wherein:
each of the first electrode and the second electrode includes a superconductive material, or
a distance between the first electrode and the second electrode is between 1 and 20 nanometers.

14. The quantum circuit assembly according to claim 1, wherein:
the SQUID is a part of a transmon qubit device of the quantum circuit assembly, and
the quantum circuit assembly further includes one or more of:
a flux bias line, configured to control a frequency of the transmon qubit device,
a readout resonator, configured to detect a quantum state of the transmon qubit device,
a direct drive line, configured to set a quantum state of the transmon qubit device, and
one or more coupling components configured to couple the transmon qubit device to one or more further transmon qubit devices.

15. A quantum computing device, comprising:
a quantum processing device that includes a plurality of qubit devices, each qubit device comprising a superconducting quantum interference device (SQUID) that includes two Josephson Junctions coupled to a superconductive loop, where at least one of the two Josephson Junctions includes a tunnel barrier comprising a resistive switching material, and where the resistive switching material includes an oxide material and an oxygen exchange material (OEM); and
a memory device configured to store data generated by the plurality of qubit devices during operation of the quantum processing device.

16. The quantum computing device according to claim 15, wherein the memory device is configured to store instructions for a quantum computing algorithm to be executed by the quantum processing device.

17. The quantum computing device according to claim 15, wherein the resistive switching material further includes a spacer material between the OEM and the oxide material.

18. The quantum computing device according to claim 15, wherein the OEM has a gradient of oxygen content between the oxide material and an electrode of the at least one of the two Josephson Junctions.

19. The quantum computing device according to claim 15, wherein:
the oxide material is a sub-stoichiometric oxide material, or
the oxide material includes hafnium and oxygen.

20. The quantum computing device according to claim 15, wherein the oxide material has an oxygen content gradient that decreases toward the OEM.

21. A quantum computing device, comprising:
a quantum circuit assembly, having:
a transmon qubit device that includes a superconducting quantum interference device (SQUID), the SQUID including two Josephson Junctions coupled to a superconductive loop, where at least one of the two Josephson Junctions includes a first electrode, a second electrode, and a resistive switching material (RSM) between the first electrode and the second electrode; and
one or more of:
a flux bias line, configured to control a frequency of the transmon qubit device,
a readout resonator, configured to detect a quantum state of the transmon qubit device,
a direct drive line, configured to set a quantum state of the transmon qubit device, and
one or more coupling components configured to couple the transmon qubit device to one or more further transmon qubit devices.

22. The quantum computing device according to claim 21, wherein the RSM includes an oxide material and an oxygen exchange material (OEM).

23. The quantum computing device according to claim 22, wherein:
the OEM has a gradient of oxygen content between the oxide material and an electrode of the at least one of the two Josephson Junctions, or
the oxide material has an oxygen content gradient that decreases toward the OEM.

24. The quantum computing device according to claim 22, wherein:
the oxide material is a sub-stoichiometric oxide material, or
the oxide material includes hafnium and oxygen.

25. The quantum computing device according to claim 21, wherein:
the quantum computing device includes a quantum processing device that includes a plurality of qubit devices,
at least one of the plurality of qubit devices is the transmon qubit device, and
the quantum computing device further includes a memory device configured to store data generated by the plurality of qubit devices during operation of the quantum processing device.

* * * * *